(12) United States Patent
Jo et al.

(10) Patent No.: US 10,510,821 B2
(45) Date of Patent: Dec. 17, 2019

(54) DISPLAY DEVICE

(71) Applicant: Samsung Display Co., Ltd., Yongin-si, Gyeonggi-do (KR)

(72) Inventors: Jungyun Jo, Yongin-si (KR);
Byoungyong Kim, Yongin-si (KR);
Seungsoo Ryu, Yongin-si (KR);
Sanghyeon Song, Yongin-si (KR);
Jeongdo Yang, Yongin-si (KR);
Jonghyuk Lee, Yongin-si (KR);
Seunghwa Ha, Yongin-si (KR);
Jeongho Hwang, Yongin-si (KR)

(73) Assignee: Innovation Counsel LLP (KR)

( * ) Notice: Subject to any disclaimer, the term of this patent is extended or adjusted under 35 U.S.C. 154(b) by 44 days.

(21) Appl. No.: 15/617,420

(22) Filed: Jun. 8, 2017

(65) Prior Publication Data

US 2017/0358642 A1 Dec. 14, 2017

(30) Foreign Application Priority Data

Jun. 10, 2016 (KR) .................... 10-2016-0072711
Oct. 11, 2016 (KR) .................... 10-2016-0131614
Apr. 5, 2017 (KR) .................... 10-2017-0044401

(51) Int. Cl.

| G06F 1/00 | (2006.01) |
|---|---|
| H01L 27/32 | (2006.01) |
| H01L 25/18 | (2006.01) |
| G06F 3/041 | (2006.01) |
| G06F 3/044 | (2006.01) |
| H01L 27/12 | (2006.01) |
| H01L 51/00 | (2006.01) |

(52) U.S. Cl.
CPC ........ H01L 27/3276 (2013.01); G06F 3/0412 (2013.01); H01L 25/18 (2013.01); G06F 3/044 (2013.01); *H01L 27/124* (2013.01); *H01L 51/0097* (2013.01); *H01L 2251/5338* (2013.01)

(58) Field of Classification Search
CPC ......... H04L 24/05; H04L 24/45; H04L 24/03; H04L 24/43; H05K 1/189; H05K 1/038; G06F 3/044
See application file for complete search history.

(56) References Cited

U.S. PATENT DOCUMENTS

| 7,019,393 B2 | 3/2006 | Toriyama | |
|---|---|---|---|
| 2012/0098788 A1* | 4/2012 | Sekiguchi | ............... G06F 3/044 345/174 |
| 2016/0228691 A1 | 8/2016 | Mathew et al. | |

(Continued)

FOREIGN PATENT DOCUMENTS

| JP | 2000-151057 A | 5/2000 |
|---|---|---|
| JP | 2001-127108 A | 5/2001 |

(Continued)

*Primary Examiner* — Michael A Faragalla
(74) *Attorney, Agent, or Firm* — Innovation Counsel LLP

(57) ABSTRACT

A display device includes: a substrate; and a plurality of pad terminals on the substrate, wherein each of the plurality of pad terminals includes a lower conductive layer and an upper conductive layer disposed on the lower conductive layer, an elastic layer disposed between the lower conductive layer and the upper conductive layer, and at least a portion of the lower conductive layer being electrically connected to at least a portion of the upper conductive layer in a region in which the elastic layer is not arranged.

24 Claims, 23 Drawing Sheets

(56) References Cited

U.S. PATENT DOCUMENTS

2016/0233179 A1* 8/2016 Huang .................... H01L 24/05
2016/0234938 A1* 8/2016 Stone ......................... C09J 9/02

FOREIGN PATENT DOCUMENTS

| | | |
|---|---|---|
| JP | 2004-095615 A | 3/2004 |
| JP | 2015-079892 A | 4/2015 |
| KR | 10-2005-0020708 A | 3/2005 |
| KR | 10-2005-0068847 A | 7/2005 |
| KR | 10-2006-0096253 A | 9/2006 |
| KR | 10-2007-0047920 A | 5/2007 |
| KR | 10-2014-0117340 A | 10/2014 |
| WO | 2013/108843 A1 | 7/2013 |

* cited by examiner

DISPLAY DEVICE

CROSS-REFERENCE TO RELATED APPLICATION

This application claims the benefit of Korean Patent Application Nos. 10-2016-0072711, filed on Jun. 10, 2016, 10-2016-0131614, filed on Oct. 11, 2016, and 10-2017-0044401, filed on Apr. 5, 2017, in the Korean Intellectual Property Office, the disclosures of which are incorporated herein in their entirety by reference.

BACKGROUND

1. Field

One or more embodiments relate to a display device.

2. Description of the Related Art

Generally, display devices may be used for mobile apparatuses such as smart phones, laptop computers, digital cameras, camcorders, personal digital assistants, notebook computers, table personal computers, or electronic apparatuses such as desktop computers, televisions, outdoor billboards, display devices for exhibition.

Recently, slimmer display devices are brought to the market.

Flexible display devices are portable device and are applicable to devices of various shapes. Among them, flexible display devices based on organic light-emitting display technology are most influential flexible display devices.

In a display device, a pad terminal on a substrate may be electrically connected to a driving terminal of a driver. An adhesive including a conductive material electrically connecting the pad terminal to the driving terminal may be arranged between the pad terminal and the driving terminal. When the pad terminal is connected to the driving terminal, connection failure due to conductive particles of the adhesive may occur.

SUMMARY

One or more embodiments include a display device in which connection between a pad terminal and a driving terminal is swift.

Additional aspects will be set forth in part in the description which follows and, in part, will be apparent from the description, or may be learned by practice of the presented embodiments.

According to one or more embodiments, a display device includes: a substrate; and a plurality of pad terminals on the substrate, wherein each of the plurality of pad terminals includes a lower conductive layer and an upper conductive layer disposed on the lower conductive layer, an elastic layer disposed between the lower conductive layer and the upper conductive layer, and at least a portion of the lower conductive layer being electrically connected to at least a portion of the upper conductive layer in a region in which the elastic layer is not arranged.

The elastic layer may include an organic material arranged directly under the upper conductive layer.

The lower conductive layer may be electrically connected to a wiring extended from a display area and the upper conductive layer may be arranged in an island shape on the lower conductive layer.

A thin film transistor including a semiconductor layer, a gate electrode, a source electrode, and a drain electrode, an organic light-emitting diode including a first electrode, an emissive layer, and a second electrode, a touch sensor including a plurality of touch electrodes, and a plurality of insulating layers respectively disposed between electrodes are arranged on the substrate, and the lower conductive layer and the upper conductive layer being respectively arranged in a same layer as the electrodes, and the elastic layer being arranged in a same layer as at least one of the plurality of insulating layers is arranged on the substrate.

At least one contact hole may be arranged in the elastic layer, at least a portion of the lower conductive layer being electrically connected to at least a portion of the upper conductive layer via the contact hole.

The upper conductive layer may extend over a region exposing the lower conductive layer via the contact hole and a region in which the elastic layer covering the lower conductive layer is arranged.

The lower conductive layer may be arranged in a same layer as the gate electrode, the upper conductive layer is arranged in a same layer as the source electrode and the drain electrode, and the elastic layer is arranged in a same layer as an interlayer insulating layer disposed between the gate electrode and the source electrode and the drain electrode.

The lower conductive layer may be arranged in a same layer as the gate electrode, the upper conductive layer may be arranged in a same layer as the first electrode, the elastic layer may include a first elastic layer and a second elastic layer, the first elastic layer being arranged in a same layer as an interlayer insulating layer disposed between the gate electrode and the source electrode and the drain electrode, the second elastic layer being arranged on the interlayer insulating layer and arranged in a same layer as a protective layer covering the source electrode and the drain electrode.

A size of region of the exposed lower conductive layer may correspond to a size of the contact hole, and an edge of the lower conductive layer is covered by the elastic layer.

The upper conductive layer may cover the lower conductive layer and the elastic layer, and the elastic layer may include a curvature pattern corresponding to its portion contacting the upper conductive layer.

The lower conductive layer may include a first conductive layer and a second conductive layer disposed on the first conductive layer, the first conductive layer is electrically connected to the second conductive layer via a contact hole formed in an insulating layer covering at least a portion of the first conductive layer, the elastic layer may cover at least a portion of the second conductive layer exposed via the contact hole formed in the insulating layer, and the upper conductive layer may be arranged on the elastic layer and electrically connected to the second conductive layer in a region in which the elastic layer is not arranged.

The first conductive layer may be arranged in a same layer as the gate electrode, the second conductive layer may be arranged in a same layer as the source electrode and the drain electrode, the elastic layer may include a plurality of elastic layers and is arranged in a same layer as a plurality of insulating layers, the plurality of insulating layers being an interlayer insulating layer disposed between the gate electrode and the source electrode and the drain electrode, a protective layer covering the source electrode and the drain electrode, a pixel-defining layer defining a sub-pixel area, and an insulating layer for a touch electrode covering the touch electrode, and the upper conductive layer may be arranged in a same layer as the touch electrode.

The elastic layer may include a plurality of stacked elastic layers, and one of the plurality of stacked elastic layers may include a curvature pattern.

The elastic layer may include: a first elastic layer disposed on the lower conductive layer and including a flat surface; at least one second elastic layer disposed on the first elastic layer and including the curvature pattern; and a third elastic layer disposed on the second elastic layer and covering the second elastic layer.

The second elastic layer may include a plurality of second elastic layers spaced apart from each other on the first elastic layer.

Each of the plurality of second elastic layers may include a hemisphere or half-ellipsoidal shape.

Each of the plurality of second elastic layers may include a curved cross-section and include a stripe shape extending in one direction of the substrate.

A second elastic layer at an outermost portion from among the plurality of second elastic layers may cover an edge of the first elastic layer.

At least two of the first elastic layer, the second elastic layer, and the third elastic layer may be formed in one body.

The plurality of pad terminals may be spaced apart from each other on the substrate, and one of the plurality of elastic layers may extend over an adjacent pad terminal, and the extended elastic layer may extend over each lower conductive layer of an adjacent pad terminal and an interval between a pair of adjacent pad terminals.

The extended elastic layer may extend in a direction crossing a direction in which the upper conductive layer and the lower conductive layer extend.

The extended elastic layer may correspond to the first elastic layer, the second elastic layer may be arranged on the first elastic layer of each pad terminal, and the third elastic layer may extend over the first elastic layer, the second elastic layer, and an interval between adjacent pad terminals.

Opposite ends of the first elastic layer may protrude outside edges of the upper conductive layer, and a region from which the first elastic layer protrudes may not be covered by the upper conductive layer.

Opposite ends of the first elastic layer may be arranged inside edges of the upper conductive layer, and the opposite ends of the first elastic layer may be covered by the upper conductive layer.

The lower conductive layer may be arranged in a same layer as the gate electrode, the source electrode, the drain electrode, the first electrode, and the second electrode, the elastic layer may be arranged in a same layer as a plurality of insulating layers, the plurality of insulating layers being an interlayer insulating layer disposed between the gate electrode and the source electrode and the drain electrode, a protective layer covering the source electrode and the drain electrode, a pixel-defining layer defining the sub-pixel area, and an insulating layer for a touch electrode covering the touch electrode, and the upper conductive layer may be arranged in a same layer as the touch electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
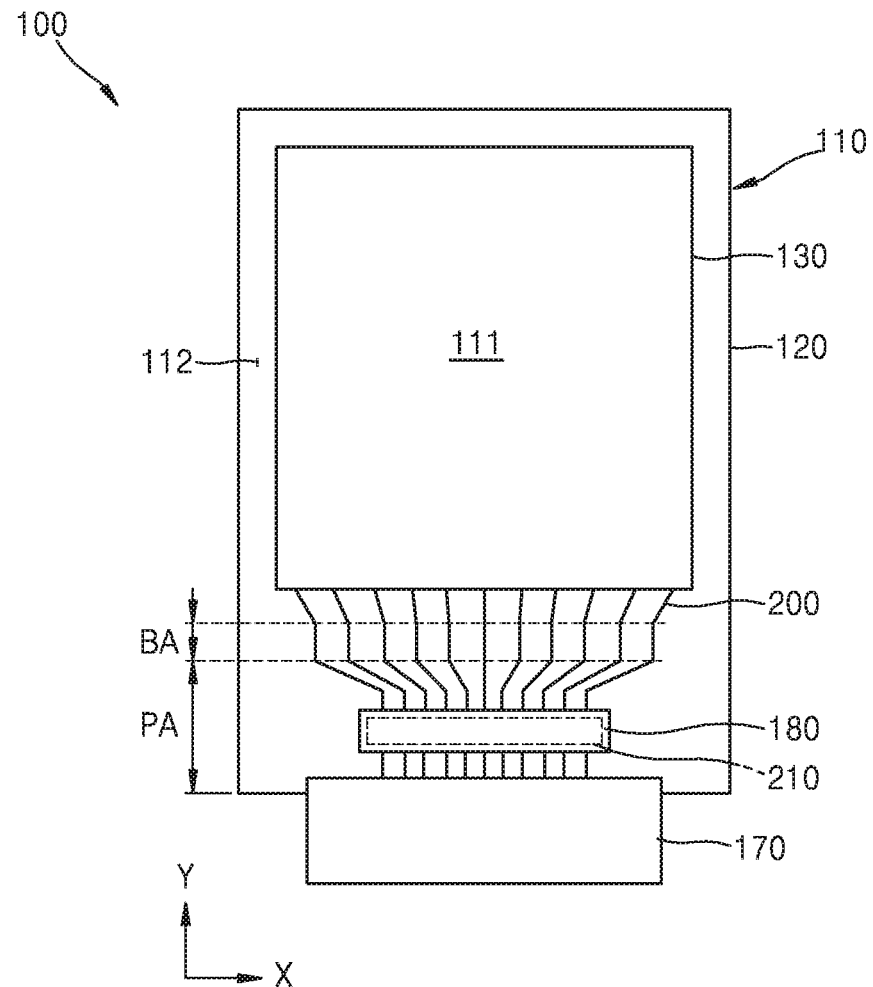
FIG. 1 is a plan view of a display device according to an embodiment.

As the disclosure allows for various changes and numerous embodiments, exemplary embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the exemplary embodiments set forth herein.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, embodiments of a display device will be described more fully with reference to the accompanying drawings, in which exemplary embodiments of the disclosure are shown. When description is made with reference to the drawings, like reference numerals in the drawings denote like or corresponding elements, and repeated description thereof will be omitted.

Figure 2:
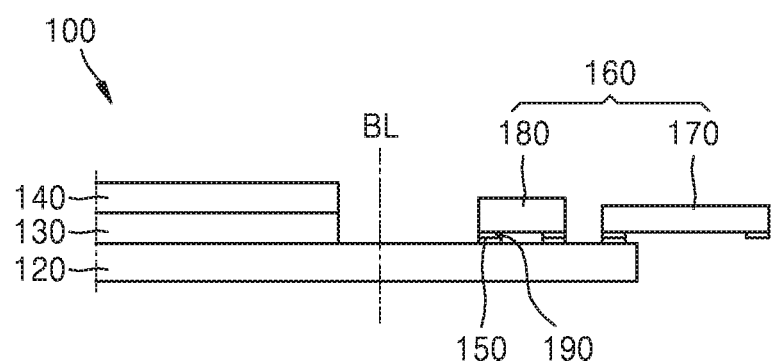
FIG. 2 is a cross-sectional view of the display device of FIG. 1.

FIG. 1 is a plan view of a display device 100 according to an embodiment, and FIG. 2 is a cross-sectional view of the display device 100 of FIG. 1.

Referring to FIGS. 1 and 2, the display device 100 includes a display panel 110. In an embodiment, the display device 100 may be an organic light-emitting display device. In another embodiment, the display device 100 may be a liquid crystal display (LCD), a field emission display (FED), or an electrophoretic display (EPD).

The display panel 110 includes a substrate 120 including a plurality of devices, and a thin film encapsulation (TFE) 130 disposed on the substrate 120. A plurality of thin film transistors (TFTs) and a plurality of light-emitting devices connected to the TFTs may be arranged on the substrate 120. A functional film 140 such as a polarization layer, a touch sensing unit, and a cover window may be arranged on the TFE 130.

The substrate 120 may include an active area (AA) 111 displaying an image and an inactive area (IAA) 112 disposed outside the AA 111.

The TFE 130 may cover the AA 111.

The IAA 112 surrounds the AA 111. A bending area BA in which the display panel 110 may be folded in one direction, and a pad area PA extending outside the bending area BA may be arranged in the IAA 112.

The display panel 110 may be folded in one direction along a bending line BL of the bending area BA.

The pad area PA may be arranged in one edge of the substrate 120. A plurality of pad terminals 150 may be arranged in the pad area PA. The plurality of pad terminals 150 may be spaced apart from each other in an X-axis direction of the substrate 120. The pad terminal 150 may be connected to a wiring 200 extending from the AA 111.

A driver 160 may be electrically connected to the plurality of pad terminals 150.

The driver 160 includes a driving circuit and may be a chip-on-plastic (COP). In an embodiment, the driver 160 includes a flexible printed circuit board (FPCB) 170 including a patterned circuit wiring, a driving integrated circuit (IC) 180 disposed on the substrate 120, and a plurality of driving terminals 190 under the driving IC 180. The FPCB 170 may be electrically connected to the driving IC 180.

In another embodiment, the driver 160 may be a chip-on-film (COF). In another embodiment, the driver 160 may be a chip-on-glass (COG).

The FPCB 170 may be electrically connected to an external board (not shown).

The plurality of pad terminals 150 may be electrically connected to a plurality of driving terminals 190, respectively. Each of the plurality of pad terminals 150 may be directly connected to a corresponding driving terminal 190, respectively.

An adhesive, for example, an adhesive tape 210 may be arranged between the pad terminals 150 and the driving terminals 190. The adhesive tape 210 may provide adhesive force between the pad terminals 150 and the driving terminals 190. The adhesive tape 210 may be arranged in the neighborhood of a region in which the pad terminals 150 are respectively connected to the driving terminals 190.

The display device 100 having the above structure may electrically connect the pad terminal 150 to the driving terminal 190 by a mounting process which is done with heat or no heat. Though the present embodiment has described, as an example, the case where the pad terminal 150 is connected to the driving terminal 190, the embodiment is not limited to one case as far as terminals arranged in different components are directly connected.

In an embodiment, the pad terminal 150 may be arranged in a plurality of columns on the substrate 120. For example, the pad terminals 150 may be arranged in different columns in a Y-axis direction of the substrate 120.

In an embodiment, the pad terminals 150 may be alternately arranged. For example, the pad terminals 150 may be arranged in zigzag.

In an embodiment, each of the pad terminals 150 includes a lower conductive layer including at least one conductive layer and an upper conductive layer disposed on the lower conductive layer.

Figure 3:
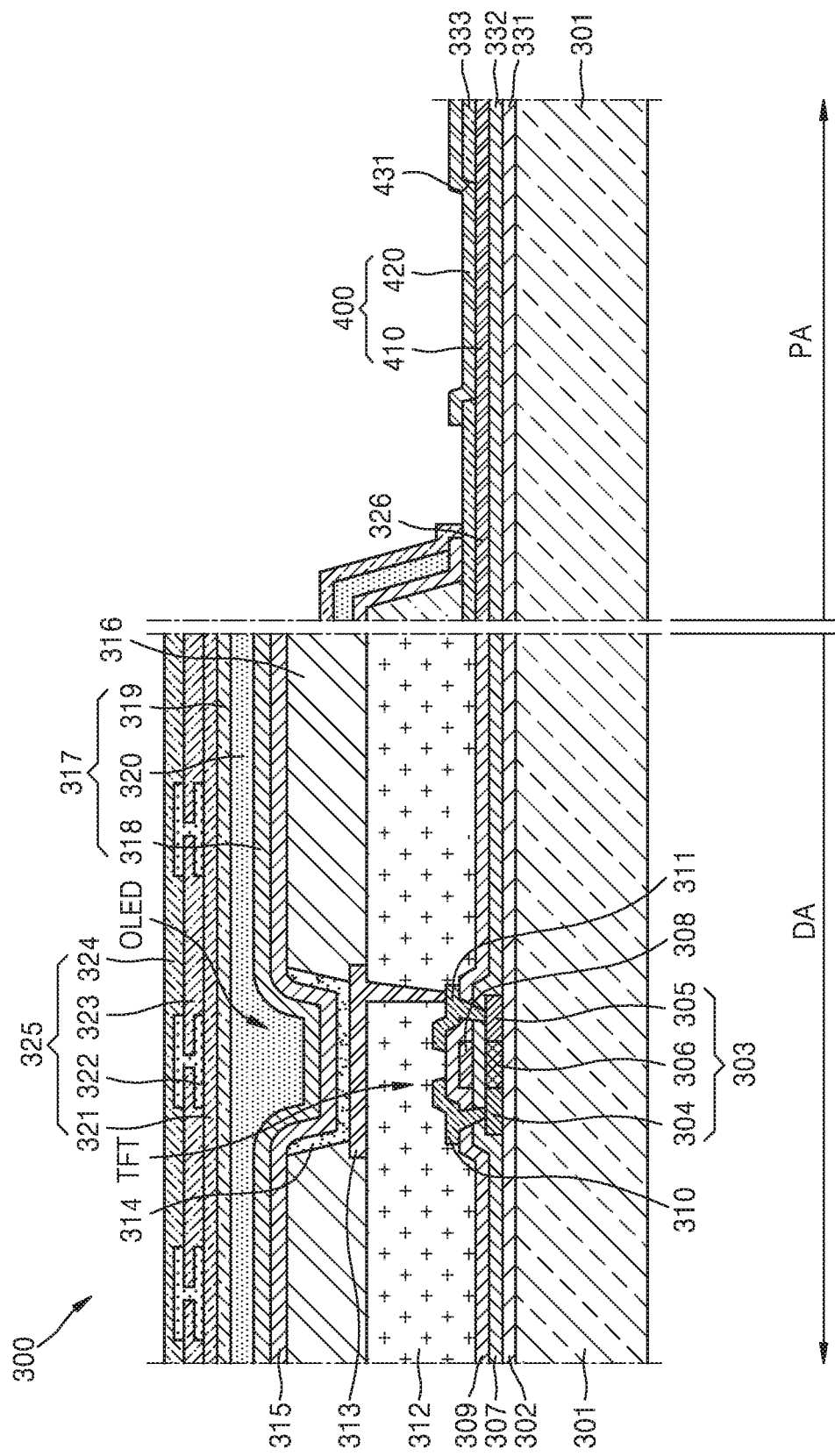
FIG. 3 is a cross-sectional view of a display panel according to an embodiment.
Figure 4:
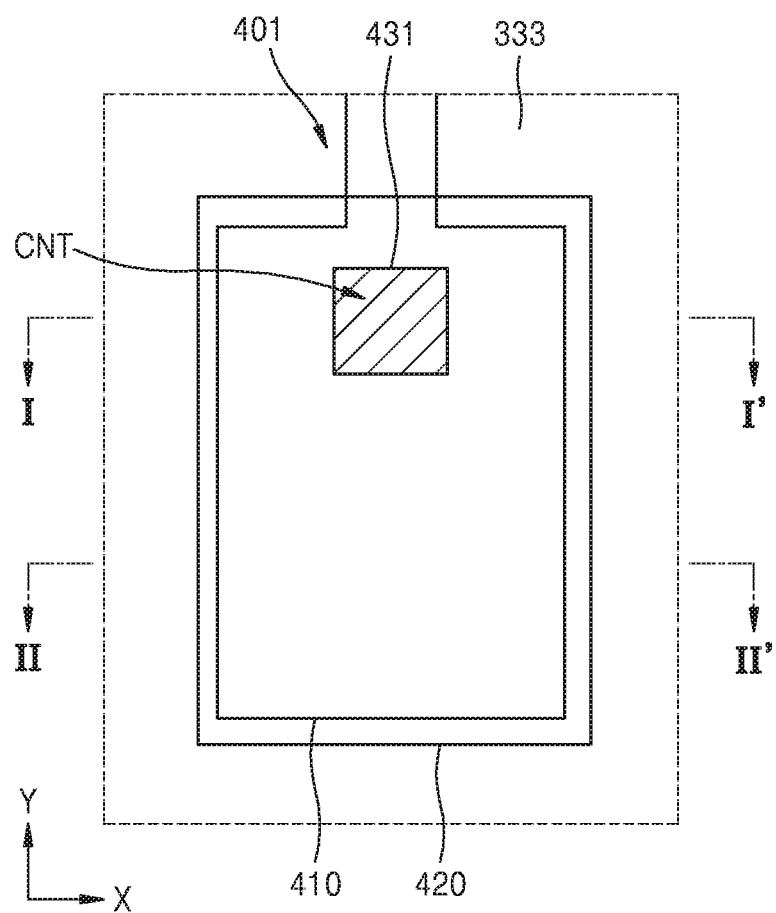
FIG. 4 is a plan view of one pad terminal of FIG. 3
Figure 5A:
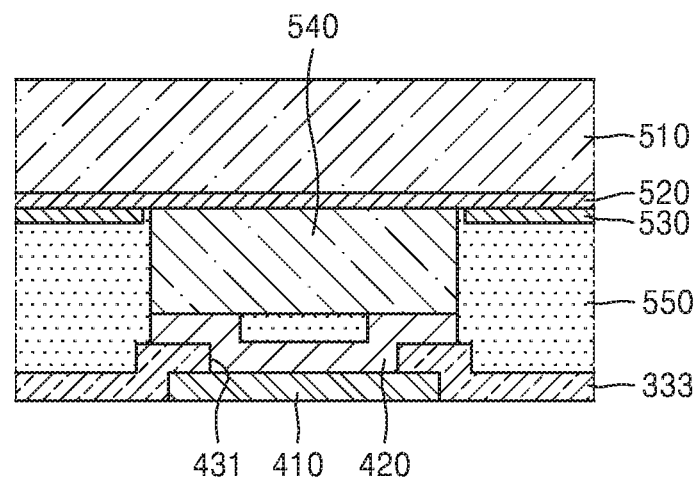
FIG. 5A is a cross-sectional view of a driving terminal connected to a pad terminal cut along a line I-I' of FIG. 4.
Figure 5B:
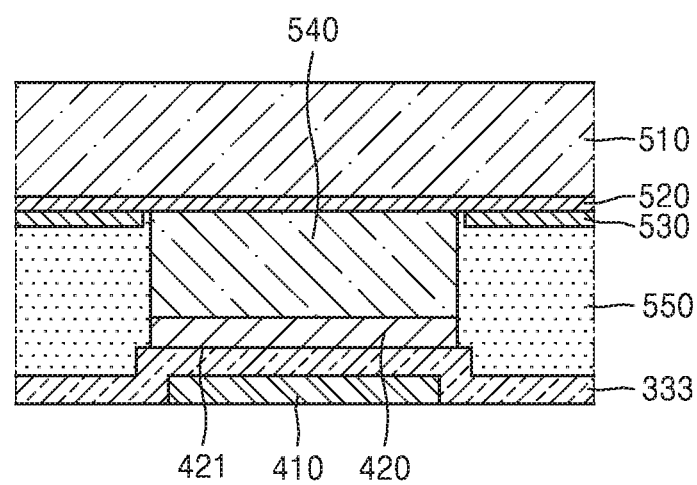
FIG. 5B is a cross-sectional view of the driving terminal connected to the pad terminal cut along a line II-II' of FIG. 4.

FIG. 3 is a cross-sectional view of a display panel 300 according to an embodiment, FIG. 4 is a plan view of one pad terminal 401 of a pad terminal 400 of FIG. 3, FIG. 5A is a cross-sectional view of a driving terminal 540 connected to a pad terminal 401 cut along a line I-I' of FIG. 4, and FIG. 5B is a cross-sectional view of the driving terminal 540 connected to the pad terminal 401 cut along a line II-II' of FIG. 4.

Referring to FIGS. 3, 4, 5A, and 5B, the display panel 300 includes a substrate 301 and the thin film encapsulation (TFE) 317. In an embodiment, the display panel 300 may be an organic light-emitting display panel.

The substrate 301 includes a display area DA of an active area (AA) and a pad area PA of an inactive area (IAA).

The substrate 301 may be a flexible glass substrate, a flexible polymer substrate, a rigid glass substrate, or a rigid polymer substrate. The substrate 301 may be transparent, translucent, or opaque.

A barrier layer 302 may be arranged on the substrate 301. The barrier layer 302 may cover an upper surface of the substrate 301. The barrier layer 302 may be an organic layer or an inorganic layer. The barrier layer 302 may be a single layer or a multi-layer.

At least one TFT may be arranged in the display area DA. In an embodiment, the number of TFTs is not limited to one.

A semiconductor layer 303 may be arranged on the barrier layer 302. The semiconductor layer 303 includes a source region 304 and a drain region 305 doped with N-type impurities or P-type impurities. A portion of the semiconductor layer 303 between the source region 304 and the drain region 305 may be a channel region 306 not doped with impurities. The semiconductor layer 303 may be an organic semiconductor, an inorganic semiconductor, or amorphous silicon. In another embodiment, the semiconductor layer 303 may be an oxide semiconductor.

A gate insulating layer 307 may be formed on the semiconductor layer 303. The gate insulating layer 307 may be an organic layer or an inorganic layer. The gate insulating layer 307 may be a single layer or a multi-layer.

A gate electrode 308 may be arranged on the gate insulating layer 307. The gate electrode 308 may include a metallic material having conductivity. For example, the gate electrode 308 may include Mo, Al, Cu, or Ti. The gate electrode 308 may be a single layer or a multi-layer.

An interlayer insulating layer 309 may be arranged on the gate electrode 308. The interlayer insulating layer 309 may be an organic layer or an inorganic layer.

A source electrode 310 and a drain electrode 311 may be arranged on the interlayer insulating layer 309. Contact holes are formed by removing a portion of the gate insulating layer 307 and a portion of the interlayer insulating layer 309. The source electrode 310 may be electrically connected to the source region 304 via the contact hole, and the drain electrode 311 may be electrically connected to the drain region 305 via the contact hole.

The source electrode 310 and the drain electrode 311 may include a metallic material having excellent conductivity. For example, the source electrode 310 and the drain electrode 311 may include Mo, Al, Cu, or Ti. The source electrode 310 and the drain electrode 311 may be a single layer or a multi-layer. For example, the source electrode 310 and the drain electrode 311 may have a stacked structure of Ti/Al/Ti.

A protective layer 312 may be arranged on the source electrode 310 and the drain electrode 311. The protective layer 312 may be an organic layer or an inorganic layer. The protective layer 312 may be a passivation layer or a planarization layer. One of a passivation layer and a planarization layer may be omitted.

The TFT may be electrically connected to an organic light-emitting diode (OLED).

The OLED may be arranged on the protective layer 312. The OLED includes a first electrode 313, an intermediate layer 314, and a second electrode 315.

The first electrode 313 may serve as an anode and include various conductive materials. The first electrode 313 includes a transparent electrode or a reflective electrode. For example, in the case where the first electrode 313 is used as a transparent electrode, the first electrode 313 includes a transparent conductive layer. In the case where the first electrode 313 is used as a reflective electrode, the first electrode 313 includes a reflective layer and a transparent conductive layer on the reflective layer. In an embodiment, the first electrode 313 may have a stacked structure of ITO/Ag/ITO.

A pixel-defining layer 316 may be arranged on the protective layer 312. The pixel-defining layer 316 may cover a portion of the first electrode 313. The pixel-defining layer 316 defines an emission region of each sub-pixel by surrounding an edge of the first electrode 313. The first electrode 313 may be patterned for each sub-pixel. The pixel-defining layer 316 may be an organic layer or an inorganic layer. The pixel-defining layer 316 may be a single layer or a multi-layer.

An intermediate layer 314 may be arranged on an exposed portion of the first electrode 313 by the pixel-defining layer 316. The intermediate layer 314 may be formed by a deposition process.

The intermediate layer 314 may include an organic emissive layer.

In another example, the intermediate layer 314 may include an organic emissive layer and may further include at least one of a hole injection layer (HIL), a hole transport layer (HTL), an electron transport layer (ETL), and an electron injection layer (EIL).

In an embodiment, the intermediate layer 314 may include an organic emissive layer and further include various functional layers.

The second electrode 315 may be arranged on the intermediate layer 314.

The second electrode 315 may serve as a cathode. The second electrode 315 includes a transparent electrode or a reflective electrode. For example, in the case where the second electrode 315 is a transparent electrode, the second electrode 315 includes a metallic layer and a transparent conductive layer on the metallic layer. In the case where the second electrode 315 is a reflective electrode, the second electrode 315 includes a metallic layer.

In an embodiment, a plurality of sub-pixels may be arranged on the substrate 301. For example, each sub-pixel may produce red, green, blue, or white color. However, the embodiment is not limited thereto.

The TFE 317 may cover an OLED.

The TFE 317 may include alternately stacked inorganic layers 318 and 319 and organic layer 320. For example, the first inorganic layer 318, the organic layer 320, and the second inorganic layer 319 may be sequentially stacked on the OLED. A stacked structure of the inorganic layers and the organic layer of the TFE 317 may be modified variously.

A touch sensing unit 325 may be installed on the TFE 317. In an embodiment, the touch sensing unit 325 may be an electrostatic capacitive type touch sensing unit.

A base layer 321 may be arranged on the TFE 317. A plurality of touch electrodes 322 may be arranged on the base layer 321. The touch electrode 322 may have a stacked structure of Ti/Al/Ti. In another embodiment, the base layer 321 may be omitted, and the plurality of touch electrodes 322 may be directly arranged on the TFE 317.

The touch electrode 322 may be covered by insulating layers 323 and 324 for a touch electrode. The insulating layers 323 and 324 for a touch electrode may be organic layers or inorganic layers. In an embodiment, as far as the touch sensing unit 325 has a structure in which the touch electrodes 322 and the insulating layers 323 and 324 for a touch electrode including at least one layer, the touch sensing unit 325 is not limited to one structure.

A plurality of pad terminals 400 may be arranged in the pad area PA. Pad terminals 401 of the pad terminal 400 may be spaced apart from each other in a first direction (an X-axis direction) of the substrate 301.

Each pad terminal 401 includes a lower conductive layer 410 including at least one layer and an upper conductive layer 420 on the lower conductive layer 410. An elastic layer 333 may be arranged between the lower conductive layer 410 and the upper conductive layer 420. The elastic layer 333 may have a contact hole CNT 431 to expose the lower conductive layer 410 and cover at least one region of the lower conductive layer 410. At least a portion of the lower conductive layer 410 may be electrically connected to at least a portion of the upper conductive layer 420 in the contact hole 431.

Specifically, a first insulating layer 331 may be arranged in the pad area PA of the substrate 301. The first insulating layer 331 may be arranged in a same layer as the barrier layer 302. The first insulating layer 331 may include the same material as that of the barrier layer 302 and may be formed during the same process as that of the barrier layer 302.

A second insulating layer 332 may be arranged on the first insulating layer 331. The second insulating layer 332 may be arranged in a same layer as the gate insulating layer 307. The second insulating layer 332 may include the same material as that of the gate insulating layer 307 and may be formed during the same process as that of the gate insulating layer 307.

The lower conductive layer 410 of each pad terminal 401 may be arranged on the second insulating layer 332. The lower conductive layer 410 may be electrically connected to a wiring 326 extending from the display area DA. The lower conductive layer 410 may be arranged in a same layer as the gate electrode 308. The lower conductive layer 410 may include the same material as that of the gate electrode 308 and may be formed during the same process as that of the gate electrode 308. The lower conductive layers 410 may be spaced apart from each other in the first direction (the X-axis direction) of the substrate 301.

The elastic layer 333 may be arranged on the lower conductive layer 410. The elastic layer 333 may be arranged in a same layer as the interlayer insulating layer 309. The elastic layer 333 may include the same material as that of the interlayer insulating layer 309 and may be formed during the same process as that of the interlayer insulating layer 309. In an embodiment, the elastic layer 333 may include an organic material.

The elastic layer 333 may cover at least a portion of the lower conductive layer 410. Specifically, a contact hole 431 may be formed by removing a portion of the elastic layer 333 on the lower conductive layer 410. An upper surface of the lower conductive layer 410 may be exposed to outside by the contact hole 431.

The upper conductive layer 420 may be arranged on the lower conductive layer 410. The upper conductive layer 420 may be arranged in an island form on the lower conductive layer 410. In another embodiment, the upper conductive layer 420 may be electrically connected to a wiring extended from the display area DA.

The upper conductive layer 420 may be arranged in a same layer as the source electrode 310 and the drain electrode 311. The upper conductive layer 420 may include the same material as that of the source electrode 310 and the drain electrode 311 and may be formed during the same process as that of the source electrode 310 and the drain electrode 311. In an embodiment, the upper conductive layer 420 may have a stacked structure of Ti/Al/Ti. The structure of the upper conductive layer 420 may be embodied variously.

The upper conductive layer 420 may be electrically connected to the lower conductive layer 410 via the contact hole 431. The upper conductive layer 420 may be electrically connected to the lower conductive layer 410 in the contact hole 431. The lower conductive layer 410 and the upper conductive layer 420 may form a contact portion CNT in a region in which the contact hole 431 is arranged. The contact portion CNT may be a portion in which the lower conductive layer 410 is electrically connected to the upper conductive layer 420.

The upper conductive layer 420 may extend over a partial region of the lower conductive layer 410 exposed via the contact hole 431 in FIG. 5A and a region in which the elastic layer 333 covering the lower conductive layer 410 in FIG. 5B is arranged.

A size of the upper conductive layer 420 may be greater than a size of the lower conductive layer 410. The upper conductive layer 420 may cover the lower conductive layer 410. The lower conductive layer 410 may be electrically connected to the upper conductive layer 420 via the contact hole 431 which is a region in which the elastic layer 333 is not arranged.

As described above, a portion of the upper conductive layer 420 may be arranged in the exposed region of the lower conductive layer 410, and another portion of the upper conductive layer 420 may be arranged on the elastic layer 333.

The driving terminal 540 may be electrically connected to the pad terminal 401. A circuit pattern 520 may be arranged under a driving integrated circuit (IC) 510. An insulating layer 530 may cover a portion of the circuit pattern 520. The driving terminal 540 may be electrically connected to the circuit pattern 520. The driving terminal 540 includes a bump. The driving terminal 540 may include Au, Cu, In, or a solder.

An adhesive tape 550 may be arranged between the pad terminal 401 and the driving terminal 540. The adhesive tape 550 may be a non-conductive film (NCF). The adhesive tape 550 may be arranged around a region in which the pad terminal 401 is connected to the driving terminal 540.

When predetermined pressure and heat are applied to an upper portion of the driving IC 510 by using a pressurizer such as a hot bar, the pad terminal 401 may be connected to the driving terminal 540.

The driving terminal 540 may extend over a region in which the lower conductive layer 410 is electrically connected to the upper conductive layer 420 in FIG. 5A, and a region in which the lower conductive layer 410 is spaced apart from the upper conductive layer 420 with the elastic layer 333 therebetween in FIG. 5B.

A size of the driving terminal 540 may be greater than a size of the upper conductive layer 420. When the driving terminal 540 is pressurized on the upper conductive layer 420, the driving terminal 540 simultaneously pressurizes an upper portion of the upper conductive layer 420 corresponding to the region in which the lower conductive layer 410 is connected to the upper conductive layer 420 in FIG. 5A, and an upper portion of the upper conductive layer 420 corresponding to a region in which the lower conductive layer 410 is spaced apart from the upper conductive layer 420 with the elastic layer 333 therebetween in FIG. 5B. Therefore, the pad terminal 400 may be connected to the driving terminal 540.

In an embodiment, each pad terminal 401 may surface-contact the driving terminal 540.

In another embodiment, the driving terminal 540 may be selectively arranged on only an upper portion of the upper conductive layer 420 corresponding to a region in which the lower conductive layer 410 is spaced apart from the upper conductive layer 420 with the elastic layer 333 therebetween, and may pressurize the upper portion of the upper conductive layer 420.

After bonding, the adhesive tape 550 may expand due to absorption of moisture and delamination of each pad terminal 401 and the driving terminal 540 may occur. Even when the adhesive tape 550 expands, since the elastic layer 333 elastically supports a lower surface of the upper conductive layer 420, the connection between the each pad terminal 401 and the driving terminal 540 may be secured.

Specifically, the elastic layer 333 may be arranged under the upper conductive layer 420 in a region in which the lower conductive layer 410 does not directly contact the upper conductive layer 420. The upper conductive layer 420 may be an uppermost layer of the pad terminal 401 contacting the driving terminal 540. The elastic layer 333 may be arranged directly under the upper conductive layer 420.

When the driving terminal 540 is pressurized on the upper conductive layer 420, electric connection between the upper conductive layer 420 and the driving terminal 540 may be maintained by elasticity of the elastic layer 333 in the region in which the lower conductive layer 410 is spaced apart from the upper conductive layer 420 with the elastic layer 333 therebetween.

As described above, since the elastic layer 333 elastically supports the upper conductive layer 420, connection failure between the pad terminal 401 and the driving terminal 540 may be prevented.

In an embodiment, the lower conductive layer 410 and the upper conductive layer 420 may be arranged in a same layer as the gate electrode 308, the source electrode 310, and the drain electrode 311. However, the lower conductive layer 410 and the upper conductive layer 420 may be arranged in a same layer as other metallic layers on the substrate 301 of FIG. 3, for example, the first electrode 313, the second electrode 315, and the touch electrode 322.

In an embodiment, the elastic layer 333 may include an organic material and may be arranged in a same layer as not only the interlayer insulating layer 309 but also an insulating layer, for example, the gate insulating layer 307, the protective layer 312, the pixel-defining layer 316, the TFE 317, and the insulating layers 323 and 324 for a touch electrode.

Figure 6:
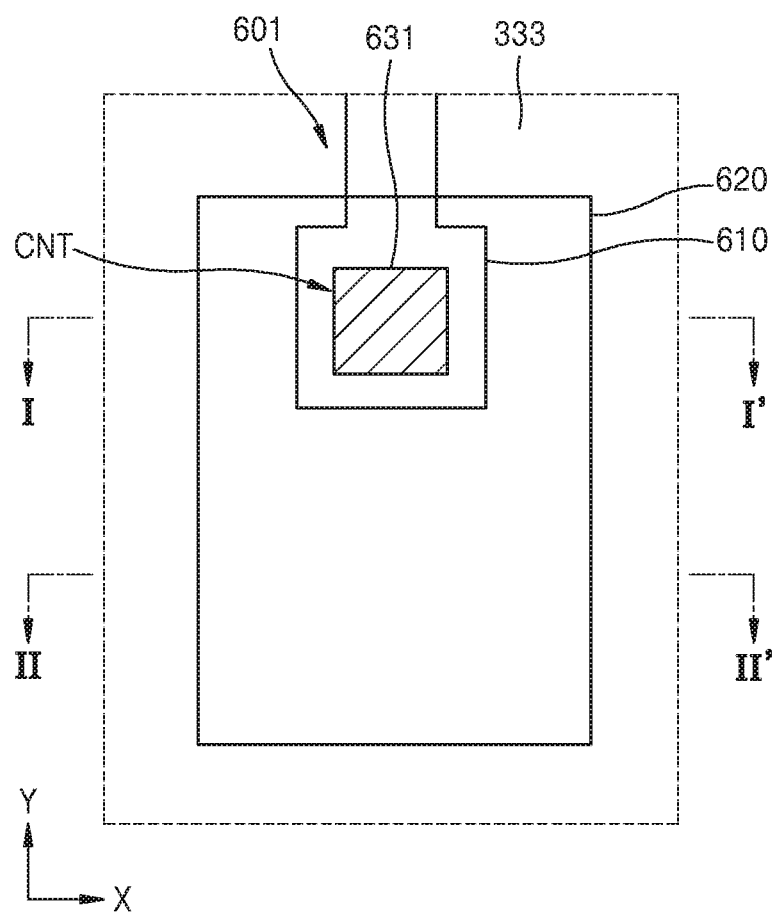
FIG. 6 is a plan view of a pad terminal according to an embodiment.
Figure 7A:
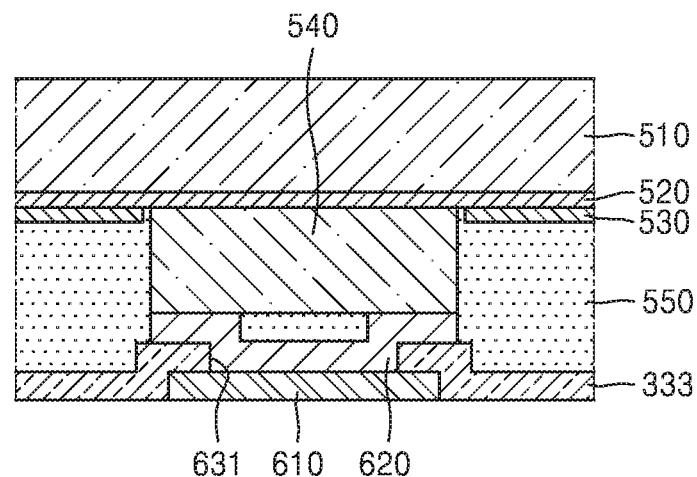
FIG. 7A is a cross-sectional view of a driving terminal connected to the pad terminal cut along a line I-I' of FIG. 6.
Figure 7B:
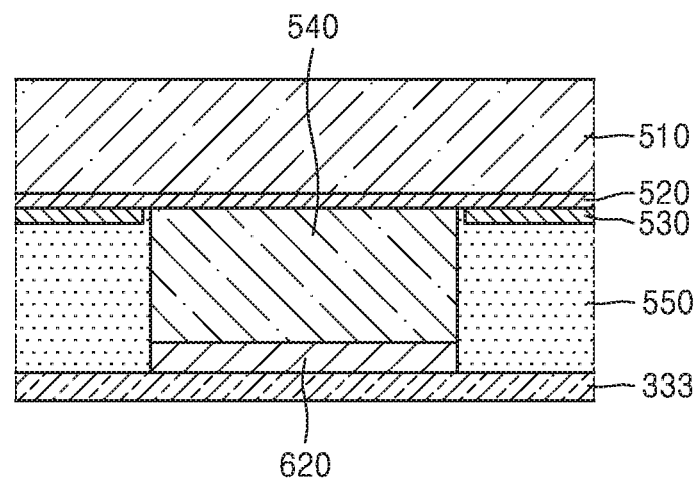
FIG. 7B is a cross-sectional view of the driving terminal connected to the pad terminal cut along a line II-II' of FIG. 6.

FIG. 6 is a plan view of a pad terminal 601 according to an embodiment, FIG. 7A is a cross-sectional view of the driving terminal 540 connected to the pad terminal 601 cut along a line I-I' of FIG. 6, and FIG. 7B is a cross-sectional view of the driving terminal 540 connected to the pad terminal 601 cut along a line II-II' of FIG. 7.

Since the pad terminal 601 is the same as the pad terminal 401 of FIG. 4 with only difference in a size of a lower conductive layer 620, a characteristic portion of the present embodiment is mainly described below.

Referring to FIGS. 6, 7A, and 7B, the pad terminal 601 includes a lower conductive layer 610 and an upper conductive layer 620 on the lower conductive layer 610. The elastic layer 333 may be arranged between the lower conductive layer 610 and the upper conductive layer 620.

The lower conductive layer 610 may be arranged in a same layer as the gate electrode 308 (see FIG. 3). The lower conductive layer 610 may include the same material as that of the gate electrode 308 and may be formed during the same process as that of the gate electrode 308.

The upper conductive layer 620 may be arranged in a same layer as the source electrode 310 and the drain electrode 311 (see FIG. 3). The upper conductive layer 620 may include the same material as that of the source electrode 310 and the drain electrode 311 and may be formed during the same process as that of the source electrode 310 and the drain electrode 311.

At least a portion of the lower conductive layer 610 may be electrically connected to at least a portion of the upper conductive layer 620 in a region in which the elastic layer 333 is not arranged.

Unlike the pad terminal 401 (see FIG. 4), the lower conductive layer 610 may be selectively arranged in only a region in which an upper surface of the lower conductive layer 610 is exposed via a contact hole 631. That is, a size of the lower conductive layer 610 may be less than a size of the lower conductive layer 410 (see FIG. 3).

Specifically, a size of region of the exposed lower conductive layer 610 may correspond to a size of the contact hole 631. In an embodiment, an edge of the lower conductive layer 610 may be covered by the elastic layer 333 during the manufacturing process. The upper conductive layer 620 may extend over the region in which an upper surface of the lower conductive layer 610 is exposed via the contact hole 631, and a region in which the elastic layer 333 where the lower conductive layer 610 does not exist is arranged.

The driving terminal 540 may extend over the region in which the lower conductive layer 610 is electrically connected to the upper conductive layer 620 in FIG. 7A, and the upper conductive layer 620 on the elastic layer 333 corresponding to the region in which the lower conductive layer 610 does not exist in FIG. 7B.

The driving terminal 540 may simultaneously pressurize an upper portion of the upper conductive layer 620 corresponding to the region in which the lower conductive layer 610 is connected to the upper conductive layer 620 in FIG. 7A, and an upper portion of the upper conductive layer 620 on the elastic layer 333 corresponding to the region in which the lower conductive layer 610 does not exist in FIG. 7B.

In an embodiment, the pad terminal 601 may surface-contact the driving terminal 540.

In another embodiment, the driving terminal 540 may be selectively arranged on only the upper portion of the upper conductive layer 620 on the elastic layer 333 corresponding to the region in which the lower conductive layer 610 does not exist and may pressurize the upper portion of the upper conductive layer 620.

Figure 8A:
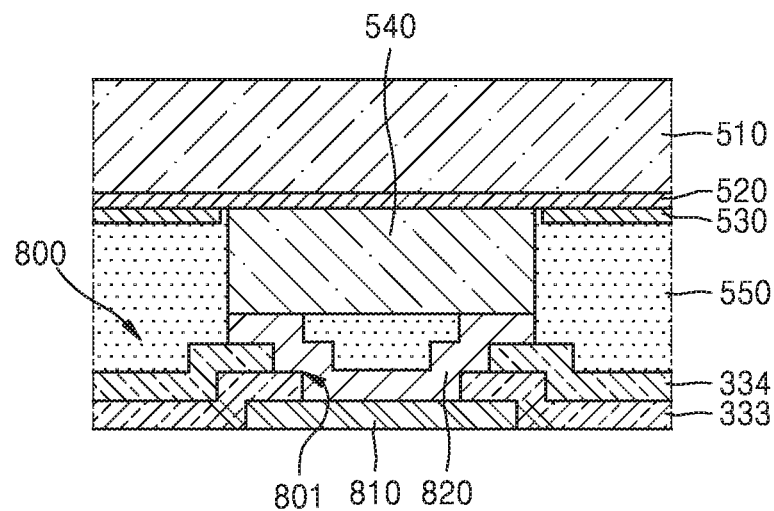
FIG. 8A is a cross-sectional view of one region in which the driving terminal is connected to a pad terminal according to another embodiment.
Figure 8B:
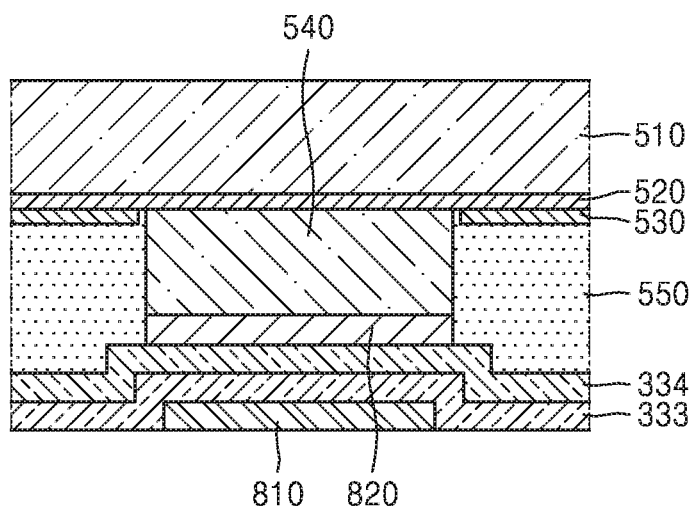
FIG. 8B is a cross-sectional view of another region in which the driving terminal is connected to the pad terminal of FIG. 8A.

FIG. 8A is a cross-sectional view of one region in which the driving terminal 540 is connected to a pad terminal 800 according to another embodiment, and FIG. 8B is a cross-sectional view of another region in which the driving terminal 540 is connected to the pad terminal 800 of FIG. 8A.

In an embodiment, one region of FIG. 8A may correspond to one region of FIG. 5A, and another region of FIG. 8B may correspond to another region of FIG. 5B.

Referring to FIG. 8A, the pad terminal 800 includes a lower conductive layer 810 and an upper conductive layer 820 on the lower conductive layer 810. A plurality of elastic layers 333 and 334 may be arranged between the lower conductive layer 810 and the upper conductive layer 820.

The lower conductive layer 810 may be arranged in a same layer as the gate electrode 308 (see FIG. 3). The lower conductive layer 810 may include the same material as that of the gate electrode 308 and may be formed during the same process as that of the gate electrode 308.

The elastic layers 333 and 334 may be arranged on the lower conductive layer 810. The elastic layers 333 and 334 may include the first elastic layer 333 and the second elastic layer 334 on the first elastic layer 333.

The first elastic layer 333 may be arranged in a same layer as the interlayer insulating layer 309 (see FIG. 3). The first elastic layer 333 may include the same material as that of the interlayer insulating layer 309 and may be formed during the same process as that of the interlayer insulating layer 309. The first elastic layer 333 includes an organic material.

The second elastic layer 334 may be arranged on the first elastic layer 333. The second elastic layer 334 may be arranged in a same layer as the protective layer 312 covering the source electrode 310 and the drain electrode 311 (see FIG. 3). The second elastic layer 334 may include the same material as that of the protective layer 312 and may be formed during the same process as that of the protective layer 312. The second elastic layer 334 includes an organic material.

The elastic layers 333 and 334 may cover at least a portion of the lower conductive layer 810. In an embodiment, at least a portion of the lower conductive layer 810 may be electrically connected to at least a portion of the upper conductive layer 820 in a region in which the elastic layers 333 and 334 are not arranged.

Specifically, a contact hole 801 may be formed on the lower conductive layer 810 by removing a portion of the elastic layers 333 and 334. An upper surface of the lower conductive layer 810 may be exposed to outside in a region in which the elastic layers 333 and 334 are not arranged.

The upper conductive layer 820 may be arranged in a region in which the lower conductive layer 810 is exposed through the contact hole 801. The upper conductive layer 820 may be arranged in a same layer as the first electrode 313 of the OLED (see FIG. 3). The upper conductive layer 820 may include the same material as that of the first electrode 313 and may be formed during the same process as that of the first electrode 313.

The driving terminal 540 may extend over the region in which the lower conductive layer 810 is electrically connected to the upper conductive layer 820 in FIG. 8A, and a region in which the lower conductive layer 810 is spaced apart from the upper conductive layer 820 with the elastic layers 333 and 334 therebetween in FIG. 8B.

The driving terminal 540 may simultaneously pressurize an upper portion of the upper conductive layer 820 corresponding to the region in which the lower conductive layer 810 is connected to the upper conductive layer 820 in FIG. 8A, and an upper portion of the upper conductive layer 820 corresponding to a region in which the lower conductive layer 810 is spaced apart from the upper conductive layer 820 with the elastic layers 333 and 334 therebetween in FIG. 8B. Therefore, the pad terminal 800 may be connected to the driving terminal 540.

In an embodiment, the pad terminal 800 may surface-contact the driving terminal 540.

In another embodiment, the driving terminal 540 may be selectively arranged on only an upper portion of the upper conductive layer 820 corresponding to a region in which the lower conductive layer 810 is spaced apart from the upper conductive layer 820 with the elastic layers 333 and 334 therebetween, and may pressurize the upper portion of the upper conductive layer 820.

Figure 9:
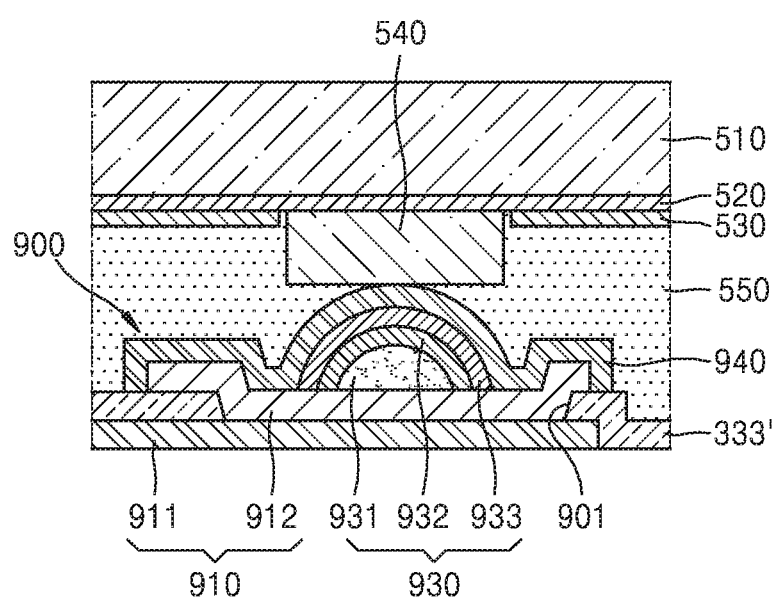
FIG. 9 is a cross-sectional view of the driving terminal connected to a pad terminal according to another embodiment.

FIG. 9 is a cross-sectional view of the driving terminal 540 connected to a pad terminal 900 according to another embodiment.

Referring to FIG. 9, the pad terminal 900 includes a lower conductive layer 910 and an upper conductive layer 940 disposed on the lower conductive layer 910. The lower conductive layer 910 includes a first conductive layer 911 and a second conductive layer 912 disposed on the first conductive layer 911.

The first conductive layer 911 may be electrically connected to a wiring extended from the display area DA of the substrate 301 (see FIG. 3). The first conductive layer 911 may be arranged in a same layer as the gate electrode 308 (see FIG. 3). The first conductive layer 911 may include the same material as that of the gate electrode 308 and may be formed during the same process as that of the gate electrode 308.

An insulating layer 333' covering at least a portion of the first conductive layer 911 may be arranged on the first conductive layer 911. In an embodiment, the insulating layer 333' may be an elastic layer. The insulating layer 333' may be arranged in a same layer as the interlayer insulating layer 309 (see FIG. 3). The insulating layer 333' may include an organic material. A contact hole 901 may be formed on the first conductive layer 911 by removing a portion of the insulating layer 333'. An upper surface of the first conductive layer 911 may be exposed to outside via a region in which the contact hole 901 is formed.

The second conductive layer 912 may be electrically connected to the first conductive layer 911 via the contact hole 901. The second conductive layer 912 may be arranged in an island shape on the first conductive layer 911. In another embodiment, the second conductive layer 912 may be electrically connected to a wiring extended from the display area DA (see FIG. 3).

The second conductive layer 912 may be arranged in a same layer as the source electrode 310 and the drain electrode 311 (see FIG. 3). The second conductive layer 912 may include the same material as that of the source electrode 310 and the drain electrode 311 and may be formed during the same process as that of the source electrode 310 and the drain electrode 311.

An elastic layer 930 may be arranged on the second conductive layer 912. The elastic layer 930 may cover at least a portion of the second conductive layer 912. The elastic layer 930 may include a plurality of organic layers. In an embodiment, at least a portion of the lower conductive layer 910 may be electrically connected to at least a portion of the upper conductive layer 940 in a region in which the elastic layer 930 is not arranged.

Specifically, the elastic layer 930 may have a structure in which a plurality of elastic layers 931, 932, and 933 are stacked. For example, the elastic layer 930 includes the first elastic layer 931, the second elastic layer 932 disposed on the first elastic layer 931, and the third elastic layer 933 disposed on the second elastic layer 932.

The first elastic layer 931 may be arranged in a same layer as the protective layer 312 covering the source electrode 310 and the drain electrode 311. The second elastic layer 932 may be arranged in a same layer as the pixel-defining layer 316 defining a sub-pixel area. The third elastic layer 933 may be arranged in a same layer as the insulating layers 323 for a touch electrode covering the touch electrode 322. As far as the elastic layer 930 includes an organic material, the elastic layer 930 is not limited to one material.

The elastic layer 930 may be arranged in an island shape on the second conductive layer 912. The elastic layer 930 may have a hemisphere shape disposed on a center of the second conductive layer 912. However, the elastic layer 930 may extend over an adjacent second conductive layer 912.

The upper conductive layer 940 may be electrically connected to the second conductive layer 912 in a region in which the elastic layer 930 is not arranged. In an embodiment, a portion of the upper conductive layer 940 may be directly connected to the second conductive layer 912, and another portion of the upper conductive layer 940 may be arranged on the elastic layer 930. The upper conductive layer 940 may extend over a region in which the second conductive layer 912 is arranged and a region in which the elastic layer 930 is arranged. The upper conductive layer 940 may be arranged in a same layer as the touch electrode 322 (see FIG. 3).

When the driving terminal 540 is pressurized on the upper conductive layer 940, the pad terminal 900 may be connected to the driving terminal 540. Since the elastic layer 930 elastically supports a lower surface of the upper conductive layer 940, connection between each pad terminal 900 and the driving terminal 540 may be secured.

In an embodiment, the pad terminal 900 may surface-contact the driving terminal 540.

Figure 10:
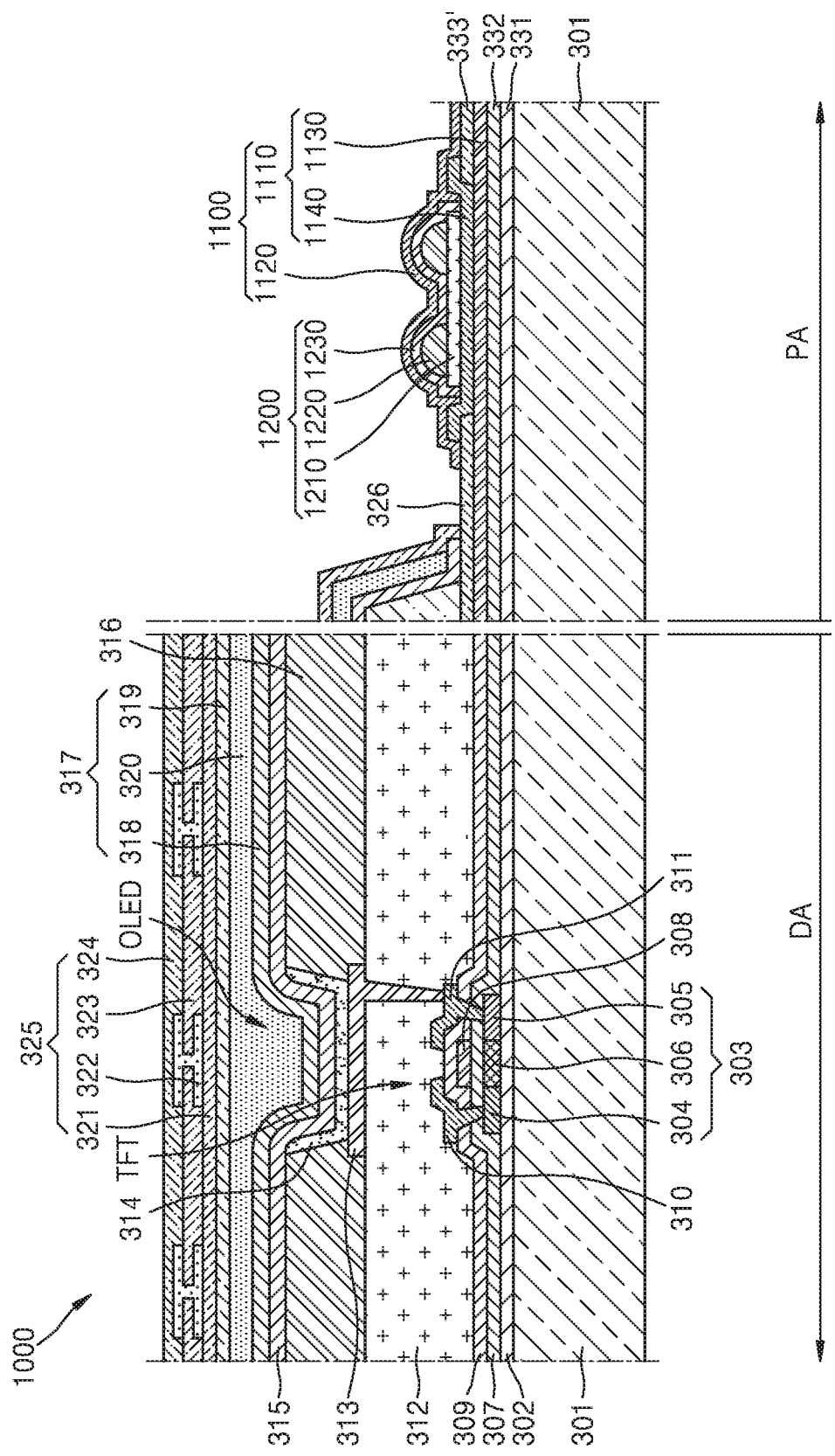
FIG. 10 is a cross-sectional view of a display panel according to another embodiment.
Figure 11:
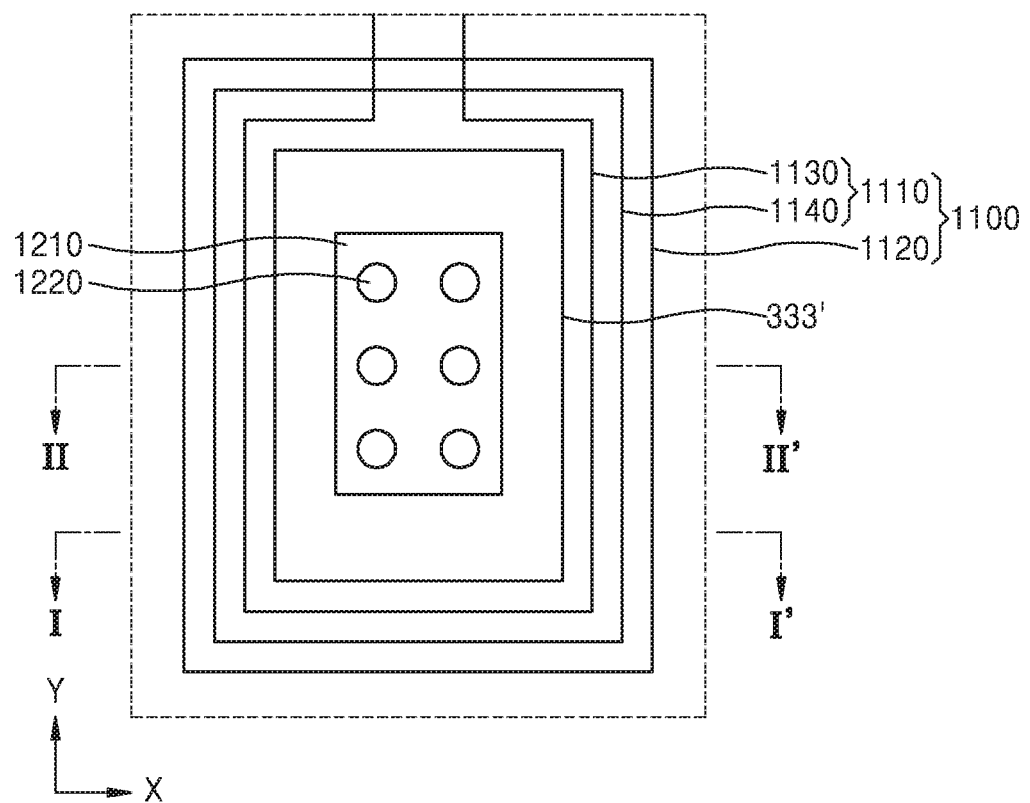
FIG. 11 is a plan view of a pad terminal of FIG. 10.
Figure 12A:
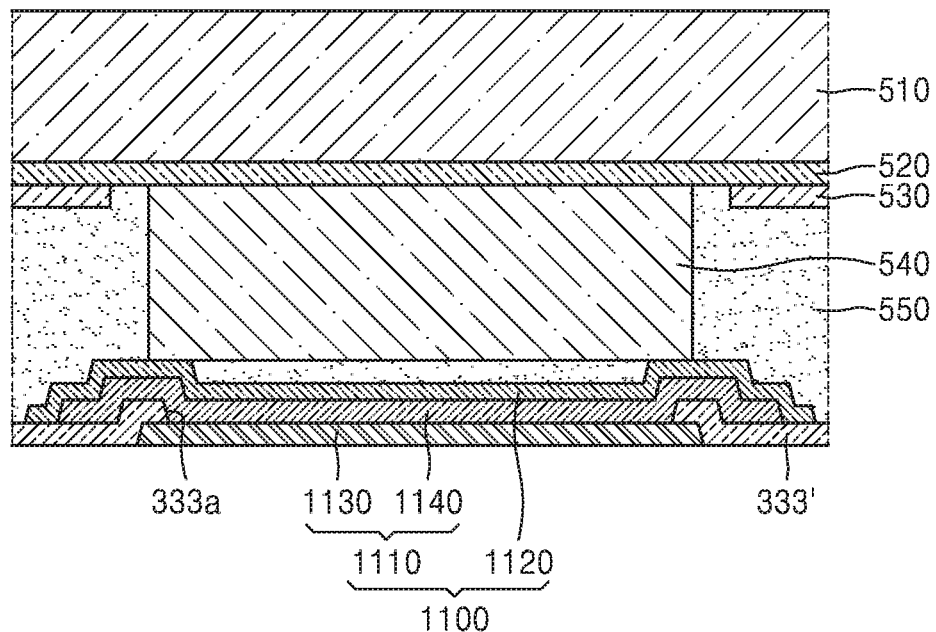
FIG. 12A is a cross-sectional view of the driving terminal connected to the pad terminal cut along a line I-I' of FIG. 11.
Figure 12B:
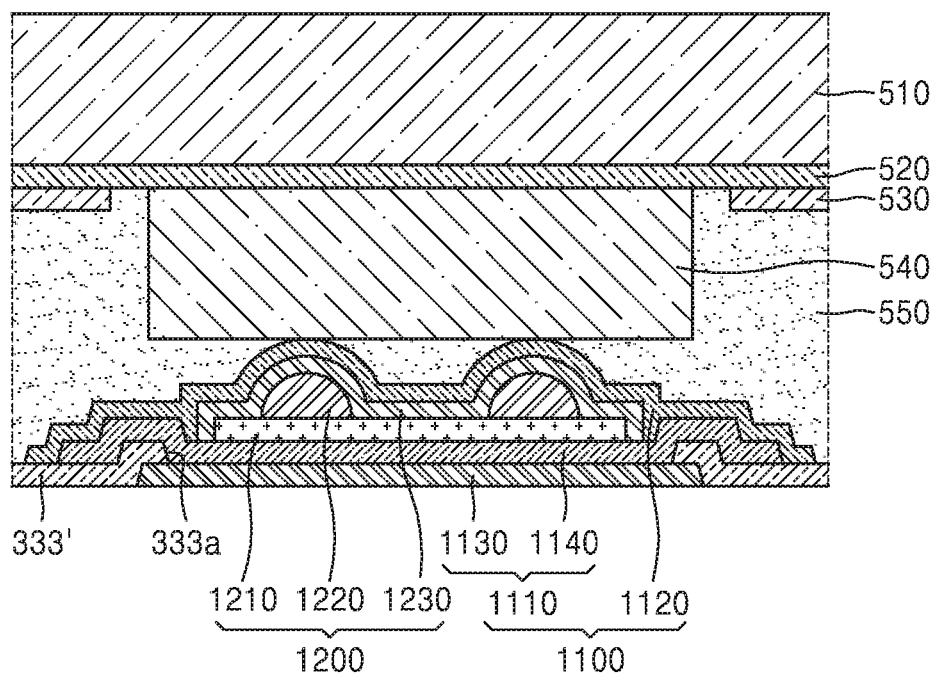
FIG. 12B is a cross-sectional view of the driving terminal connected to the pad terminal cut along a line II-II' of FIG. 11.

FIG. 10 is a cross-sectional view of a display panel 1000 according to another embodiment, FIG. 11 is a plan view of a pad terminal 1100 of FIG. 10, FIG. 12A is a cross-sectional view of the driving terminal 540 connected to the pad terminal 1100 cut along a line I-I' of FIG. 11, and FIG. 12B is a cross-sectional view of the driving terminal 540 connected to the pad terminal 1100 cut along a line II-II' of FIG. 11.

Referring to FIGS. 10, 11, 12A, and 12B, the display panel 1000 includes the substrate 301 and the TFE 317. In an embodiment, the display panel 1000 may be an organic light-emitting display panel.

The substrate 301 includes the display area DA of the AA and the pad area PA of the IAA.

The barrier layer 302 may be arranged on the substrate 301. The barrier layer 302 may be an organic layer or an inorganic layer. The barrier layer 302 may be a single layer a multi-layer.

At least one TFT may be arranged in the display area DA. In an embodiment, the number of TFTs is not limited to one.

The semiconductor layer 303 may be arranged on the barrier layer 302. The semiconductor layer 303 includes the source region 304, the drain region 305, and the channel region 306. The semiconductor layer 303 may be one of an organic semiconductor, an inorganic semiconductor, and amorphous silicon.

The gate insulating layer 307 may be arranged on the semiconductor layer 303. The gate insulating layer 307 may be an organic layer or an inorganic layer. The gate insulating layer 307 may be a single layer or a multi-layer.

The gate electrode 308 may be arranged on the gate insulating layer 307. The gate electrode 308 may include a metallic material having conductivity. The gate electrode 308 may be a single layer or a multi-layer.

The interlayer insulating layer 309 may be arranged on the gate electrode 308. The interlayer insulating layer 309 may be an organic layer or an inorganic layer.

The source electrode 310 and the drain electrode 311 may be arranged on the interlayer insulating layer 309. The source electrode 310 may be electrically connected to the source region 304 via the contact hole, and the drain electrode 311 may be electrically connected to the drain region 305 via the contact hole.

The source electrode 310 and the drain electrode 311 may include a metallic material having excellent conductivity. The source electrode 310 and the drain electrode 311 may be a single layer or a multi-layer.

The protective layer 312 may be arranged on the source electrode 310 and the drain electrode 311. The protective layer 312 may be an organic layer or an inorganic layer. The protective layer 312 may be a passivation layer or a planarization layer. One of a passivation layer and a planarization layer may be omitted.

The TFT may be electrically connected to the OLED.

The OLED may be arranged on the protective layer 312. The OLED includes the first electrode 313, the intermediate layer 314, and the second electrode 315.

The first electrode 313 may serve as an anode and include various conductive materials. The first electrode 313 includes a transparent electrode or a reflective electrode.

The pixel-defining layer 316 may be arranged on the protective layer 312. The pixel-defining layer 316 may cover a portion of the first electrode 313. The first electrode 313 may be patterned for each sub-pixel. The pixel-defining layer 316 may be an organic layer or an inorganic layer. The pixel-defining layer 316 may be a single layer or a multi-layer.

The intermediate layer 314 may be arranged on an exposed portion of the first electrode 313 by the pixel-defining layer 316.

The intermediate layer 314 may include an organic emissive layer.

In another example, the intermediate layer 314 may include an organic emissive layer and may further include at least one of an HIL, an HTL, an ETL, and an EIL.

In an embodiment, the intermediate layer 314 may include an organic emissive layer and further include various functional layers.

The second electrode 315 may be arranged on the intermediate layer 314.

The second electrode 315 may serve as a cathode. The second electrode 315 includes a transparent electrode or a reflective electrode.

The TFE 317 may cover the OLED.

The TFE 317 may include the alternately stacked inorganic layers 318 and 319 and organic layer 320.

The touch sensing unit 325 may be installed on the TFE 317. The base layer 321 may be arranged on the TFE 317. In another embodiment, the base layer 321 may be omitted.

The plurality of touch electrodes 322 may be arranged on the base layer 321. The touch electrode 322 may be covered by the insulating layers 323 and 324 for a touch electrode. The insulating layers 323 and 324 for a touch electrode may be organic layers or inorganic layers.

A plurality of pad terminals 1100 electrically connected to the driving terminal 540 may be arranged in the pad area PA. The pad terminals 1100 may be spaced apart from each other in the first direction (the X-axis direction) of the substrate 301.

The pad terminal 1100 includes a lower conductive layer 1110 including at least one layer and an upper conductive layer 1120 disposed on the lower conductive layer 1110. An elastic layer 1200 may be arranged between the lower conductive layer 1110 and the upper conductive layer 1120. The elastic layer 1200 may cover at least one region of the lower conductive layer 1110. In an embodiment, at least a portion of the lower conductive layer 1110 may be electrically connected to at least a portion of the upper conductive layer 1120 in a region in which the elastic layer 1200 is not arranged.

Specifically, the first insulating layer 331 may be arranged in the pad area PA of the substrate 301. The first insulating layer 331 may be arranged in a same layer as the barrier layer 302. The first insulating layer 331 may include the same material as that of the barrier layer 302 and may be formed during the same process as that of the barrier layer 302.

The second insulating layer 332 may be arranged on the first insulating layer 331. The second insulating layer 332 may be arranged in a same layer as the gate insulating layer 307. The second insulating layer 332 may include the same material as that of the gate insulating layer 307 and may be formed during the same process as that of the gate insulating layer 307.

The lower conductive layer 1110 of the pad terminal 1100 may be arranged on the second insulating layer 332. The lower conductive layer 1110 includes a first conductive layer 1130 and a second conductive layer 1140 disposed on the first conductive layer 1130.

The first conductive layer 1130 may be electrically connected to the wiring 326 extended from the display area DA. The first conductive layer 1130 may be arranged in same layer as the gate electrode 308. The first conductive layer 1130 may include the same material as that of the gate electrode 308 and may be formed during the same process as that of the gate electrode 308. The first conductive layers 1130 may be spaced apart from each other in the first direction (the X-axis direction) of the substrate 301.

The insulating layer 333' may be arranged on the first conductive layer 1130. In an embodiment, the insulating layer 333' may be an elastic layer. The insulating layer 333' may be arranged in a same layer as the interlayer insulating layer 309. The insulating layer 333' may include the same material as that of the interlayer insulating layer 309 and may be formed during the same process as that of the interlayer insulating layer 309. In an embodiment, the insulating layer 333' may include an organic material.

The insulating layer 333' may cover at least a portion of the first conductive layer 1130. A contact hole 333a may be formed on the first conductive layer 1130 by removing a portion of the insulating layer 333'. An upper surface of the first conductive layer 1130 may be exposed to outside via a region in which the contact hole 333a is formed.

The second conductive layer 1140 may be arranged on the first conductive layer 1130. The second conductive layer 1140 may be arranged in an island shape on the first conductive layer 1130. In another embodiment, the second conductive layer 1140 may be electrically connected to a wiring extended from the display area DA.

The second conductive layer 1140 may be arranged in a same layer as the source electrode 310 and the drain electrode 311. The second conductive layer 1140 may include the same material as that of the source electrode 310 and the drain electrode 311 and may be formed during the same process as that of the source electrode 310 and the drain electrode 311. In an embodiment, the second conductive layer 1140 may have a stacked structure of Ti/Al/Ti. The structure of the second conductive layer 1140 may be embodied variously. The second conductive layer 1140 may be electrically connected to the first conductive layer 1130 via the contact hole 333a.

In an embodiment, though the lower conductive layer 1110 has a structure in which the first conductive layer 1130 and the second conductive layer 1140 are stacked, the lower conductive layer 1110 may be modified variously. For example, the lower conductive layer 1110 may be a single layer or triple layers.

In an embodiment, the lower conductive layer 1110 may be arranged in a same layer as not only the gate electrode 308, the source electrode 310, and the drain electrode 311, but also each from among the first electrode 313 and the second electrode 315 of the OLED is arranged.

The elastic layer 1200 may be arranged on the second conductive layer 1140. The elastic layer 1200 may cover at least one region of the second conductive layer 1140. The elastic layer 1200 may have a structure in which a plurality of elastic layers 1210 to 1230 are stacked. At least one layer from among the elastic layers 1210 to 1230, for example, the elastic layer 1220, may have a curvature pattern.

Specifically, the elastic layer 1200 includes the first elastic layer 1210, the second elastic layer 1220 disposed on the first elastic layer 1210, and the third elastic layer 1230 disposed on the second elastic layer 1220.

The first elastic layer 1210 may be directly arranged on an upper surface of the second conductive layer 1140. The first elastic layer 1210 includes a flat surface. The first elastic layer 1210 may be arranged in a same layer as the protective layer 312 covering the source electrode 310 and the drain electrode 311. The first elastic layer 1210 may include the same material as that of the protective layer 312 and may be formed during the same process as that of the protective layer 312. The first elastic layer 1210 may include an organic material.

The second elastic layer 1220 may be arranged on the first elastic layer 1210. The second elastic layer 1220 may include a curvature pattern at its portion contacting the upper conductive layer 1120. The second elastic layer 1220 may include a plurality of second elastic layers. The second elastic layers 1220 may be spaced apart from each other on the first elastic layer 1210. The second elastic layer 1220 may include a hemisphere or half-ellipsoidal shape. In another embodiment, as far as the second elastic layer 1220 has a structure including a curvature shape, the second elastic layer 1220 is not limited to one shape.

The second elastic layer 1220 may be arranged in a same layer as the pixel-defining layer 316 defining a sub-pixel area. The second elastic layer 1220 may include the same material as that of the pixel-defining layer 316 and may be formed during the same process as that of the pixel-defining layer 316. The second elastic layer 1220 may include an organic material.

The third elastic layer 1230 may be arranged on the second elastic layer 1220. In an embodiment, the third elastic layer 1230 may cover both an upper surface of the first elastic layer 1210 and an upper surface of the second elastic layer 1220. In another embodiment, the third elastic layer 1230 may cover only an outer surface of the second elastic layer 1220.

The third elastic layer 1230 may be arranged in a same layer as one of the insulating layers 323 for a touch electrode covering the touch electrode 322. The third elastic layer 1230 may include the same material as that of the insulating layers 323 for a touch electrode and may be formed during the same process as that of the insulating layers 323 for a touch electrode. The third elastic layer 1230 may include an organic material.

In an embodiment, as far as the elastic layer 1200 has a structure having a curvature pattern and including one or more layers spaced apart from each other, a stacked structure of the elastic layer 1200 may be modified variously.

The upper conductive layer 1120 may cover a region in which the lower conductive layer 1110 is arranged and a region in which the elastic layer 1200 is arranged. Specifically, the upper conductive layer 1120 may completely cover the second conductive layer 1140 in FIG. 12A, and a region in which the elastic layer 1200 covering the second conductive layer 1140 in FIG. 12B. 1002311A size of the upper conductive layer 1120 may be greater than a size of the lower conductive layer 1110. The upper conductive layer 1120 may cover the lower conductive layer 1110. The upper conductive layer 1120 may be arranged in an island shape on the lower conductive layer 1110. The upper conductive layer 1120 may be arranged in a same layer as the touch electrode 322. The upper conductive layer 1120 may include the same material as that of the touch electrode 322 and may be formed during the same process as that of the touch electrode 322.

At least a portion of the lower conductive layer 1110 may be electrically connected to at least a portion of the upper conductive layer 1120 in a region in which the elastic layer 1200 is not arranged. The lower conductive layer 1110 and the upper conductive layer 1120 are not electrically connected to each other over an entire region, but may be electrically connected to each other in a region in which the elastic layer 1200 is not arranged.

In an embodiment, a portion of the upper conductive layer 1120 may be arranged in the exposed region of the lower conductive layer 1110, and another portion of the upper conductive layer 1120 may be arranged on the second elastic layer 1220 including a curvature pattern.

The driving terminal 540 may be electrically connected to the pad terminal 1100 having the above structure. A circuit pattern 520 may be arranged under the driving IC 510. The insulating layer 530 may cover a portion of the circuit pattern 520. The driving terminal 540 may be electrically connected to the circuit pattern 520. The driving terminal 540 includes a bump. The driving terminal 540 may include Au, Cu, In, a solder, or Cu—Ni.

The adhesive tape 550 may be arranged between the pad terminal 1100 and the driving terminal 540. The adhesive tape 550 may be a non-conductive film (NCF). The adhesive tape 550 may be arranged around a region in which the pad terminal 1100 is connected to the driving terminal 540.

When predetermined pressure and heat are applied to an upper portion of the driving IC 510 by using a pressurizer such as a hot bar, the pad terminal 1100 may be connected to the driving terminal 540. The upper conductive layer 1120 may be an uppermost layer of the pad terminal 1100 contacting the driving terminal 540. The elastic layer 1200 may be arranged directly under the upper conductive layer 1120.

When the driving terminal 540 is pressurized on the upper conductive layer 1120, the driving terminal 540 simultaneously pressurizes an upper portion of the upper conductive layer 1120 corresponding to the region in which the lower conductive layer 1110 is connected to the upper conductive layer 1120 in FIG. 12A, and an upper portion of the upper conductive layer 1120 corresponding to a region in which the lower conductive layer 1110 is spaced apart from the upper conductive layer 1120 with the elastic layer 1200 therebetween in FIG. 12B. Therefore, the pad terminal 1100 may be connected to the driving terminal 540.

In an embodiment, each pad terminal 1100 may surface-contact the driving terminal 540.

In another embodiment, the driving terminal 540 may be selectively arranged on only an upper portion of the upper conductive layer 1120 corresponding to a region in which the lower conductive layer 1110 is spaced apart from the upper conductive layer 1120 with the elastic layer 1200 therebetween, and may pressurize the upper portion of the upper conductive layer 1120.

After bonding, the adhesive tape 550 may expand due to absorption of moisture and delamination of the pad terminal 1100 and the driving terminal 540 corresponding to each other may occur. Even when the adhesive tape 550 expands, since the elastic layer 1200 elastically supports a lower surface of the upper conductive layer 1120, the connection between the each pad terminal 1100 and the driving terminal 540 may be secured.

Specifically, the elastic layer 1200 having a predetermined curvature pattern may be arranged between the lower conductive layer 1110 and the upper conductive layer 1120.

Electric connection between the upper conductive layer 1120 and the driving terminal 540 may be maintained by elasticity of the elastic layer 1200 in a region in which the lower conductive layer 1110 is spaced apart from the upper conductive layer 1120 with the elastic layer 1200 therebetween.

As described above, since the elastic layer 1200 elastically supports the upper conductive layer 1120, connection failure between the pad terminal 1100 and the driving terminal 540 may be prevented.

In an embodiment, the lower conductive layer 1110 and the upper conductive layer 1120 may be arranged in a same layer as the gate electrode 308, the source electrode 310, the drain electrode 311, the first electrode 313, the second electrode 315, and the touch electrode 322.

In an embodiment, the elastic layer 1200 may include an organic material and may be arranged in a same layer as at least one insulating layer, for example, the interlayer insulating layer 309, the protective layer 312, the pixel-defining layer 316, the insulating layers 323 and 324 for a touch electrode.

Meanwhile, the elastic layer 1200 disposed between the lower conductive layer 1110 and the upper conductive layer 1120 may be modified variously.

Figure 13:
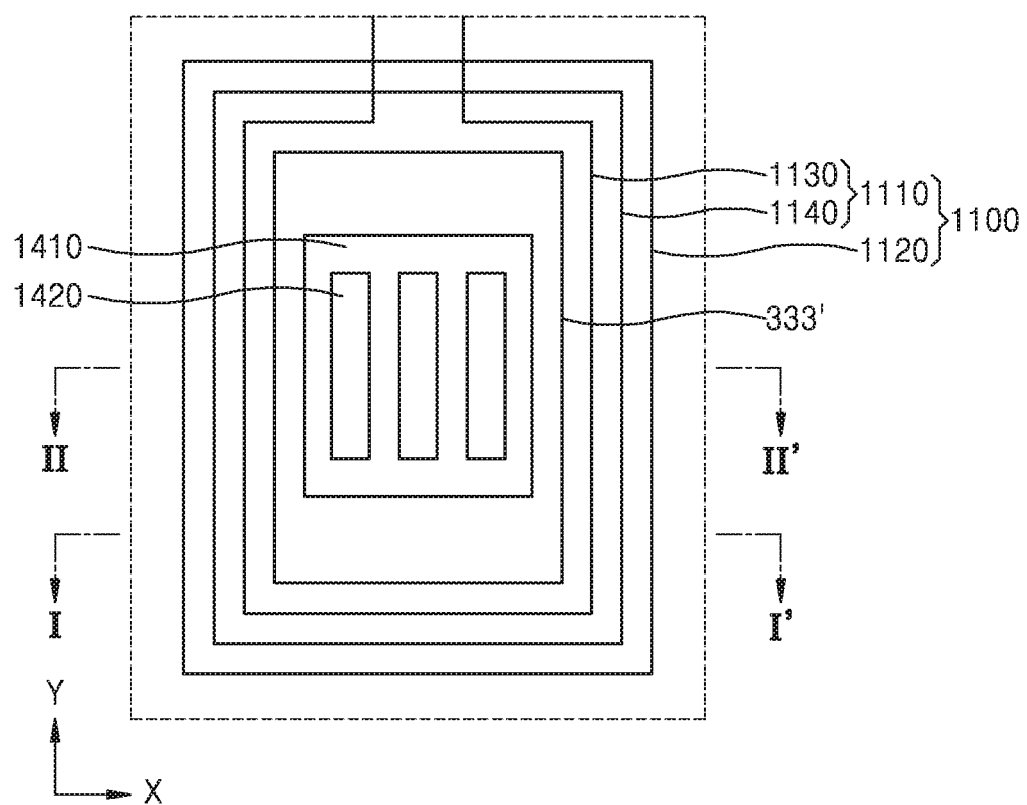
FIG. 13 is a plan view of a pad terminal according to another embodiment.
Figure 14A:
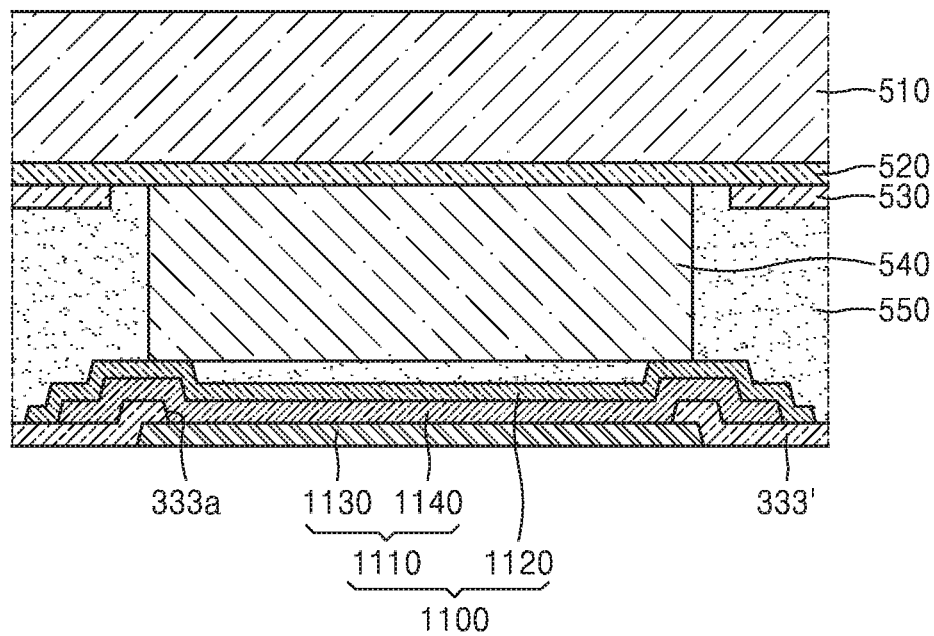
FIG. 14A is a cross-sectional view of a driving terminal connected to a pad terminal cut along a line I-I' of FIG. 13.
Figure 14B:
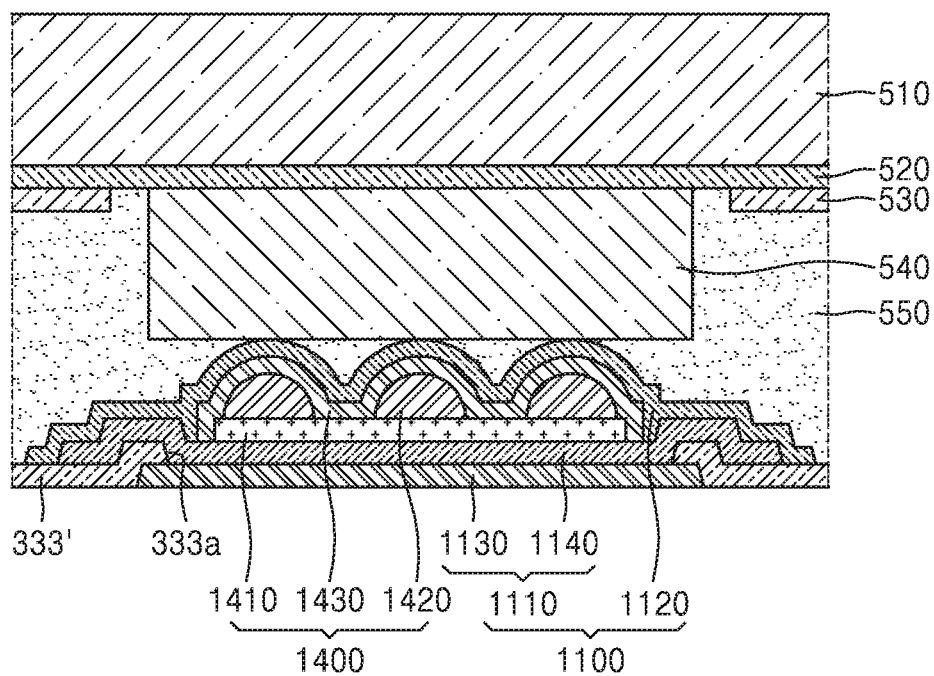
FIG. 14B is a cross-sectional view of a driving terminal connected to a pad terminal cut along a line II-II' of FIG. 13.

For example, referring to FIGS. 13, 14A, and 14B, an elastic layer 1400 may be arranged on the lower conductive layer 1110. The elastic layer 1400 includes a first elastic layer 1410, a second elastic layer 1420 disposed on the first elastic layer 1410, and a third elastic layer 1430 disposed on the second elastic layer 1420.

The first elastic layer 1410 may be directly arranged on an upper surface of the second conductive layer 1140. The first elastic layer 1410 includes a flat surface. The first elastic layer 1410 may be arranged in a same layer as the protective layer 312 covering the source electrode 310 and the drain electrode 311. The first elastic layer 1410 may include an organic material.

The second elastic layer 1420 may be arranged on the first elastic layer 1410. The second elastic layer 1420 may include a curvature pattern at its portion contacting the upper conductive layer 1120. The second elastic layer 1420 may include a plurality of second elastic layers. The second elastic layers 1420 may be spaced apart from each other on the first elastic layer 1210. Each second elastic layer 1420 may include a stripe shape extending in a second direction (a Y-axis direction) of the substrate 301. Each second elastic layer 1420 may have a curved cross-section. The second elastic layer 1420 may be arranged in a same layer as the pixel-defining layer 316 defining a sub-pixel area. The second elastic layer 1420 may include an organic material.

The third elastic layer 1430 may be arranged on the second elastic layer 1420. In an embodiment, the third elastic layer 1430 may cover both an upper surface of the first elastic layer 1410 and an upper surface of the second elastic layer 1420. In another embodiment, the third elastic layer 1430 may cover only an outer surface of the second elastic layer 1420. The third elastic layer 1430 may be arranged in a same layer as one of the insulating layers 323 for a touch electrode covering the touch electrode 322. The third elastic layer 1430 may include an organic material.

In an embodiment, as far as the elastic layer 1400 has a structure having a curvature pattern and including one or more layers spaced apart from each other, a stacked structure of the elastic layer 1400 may be modified variously.

The upper conductive layer 1120 may extend to a region in which the lower conductive layer 1110 is arranged, and a region in which the elastic layer 1400 is arranged. Specifically, the upper conductive layer 1120 may completely cover the second conductive layer 1140 in FIG. 14A, and a region in which the elastic layer 1400 covering the second conductive layer 1140 in FIG. 14B. At least a portion of the lower conductive layer 1110 may be electrically connected to at least a portion of the upper conductive layer 1120 in a region in which the elastic layer 1400 is not arranged.

Figure 15:
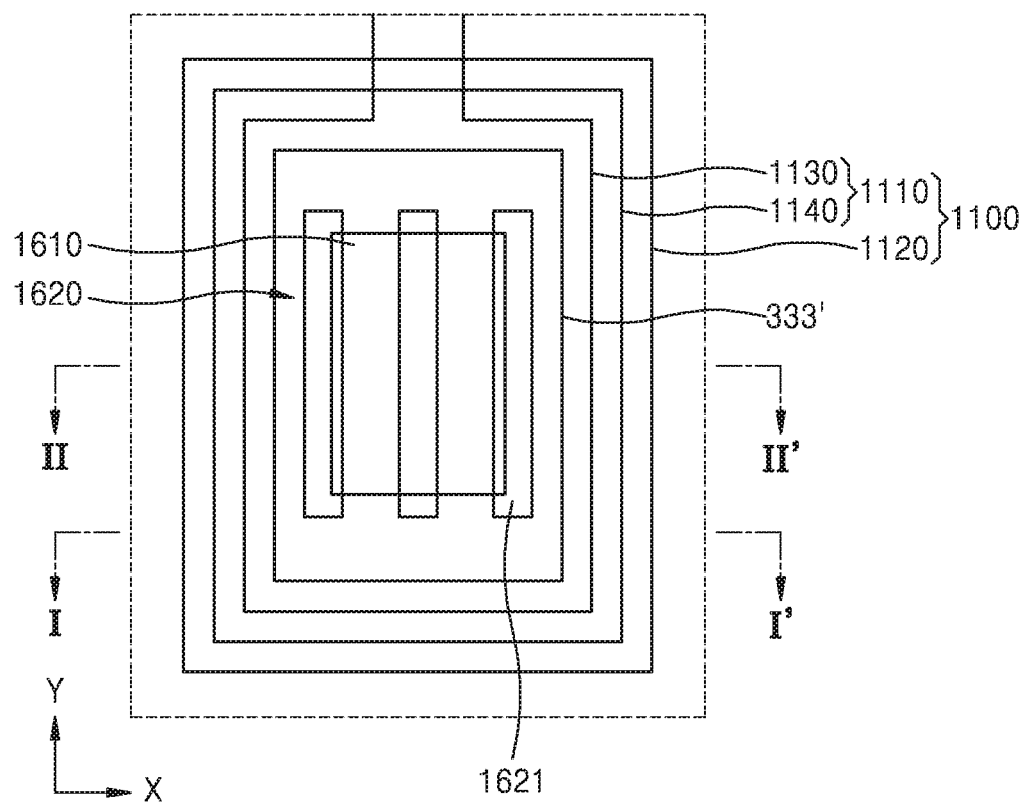
FIG. 15 is a view of a modification of the pad terminal of FIG. 13.
Figure 16A:
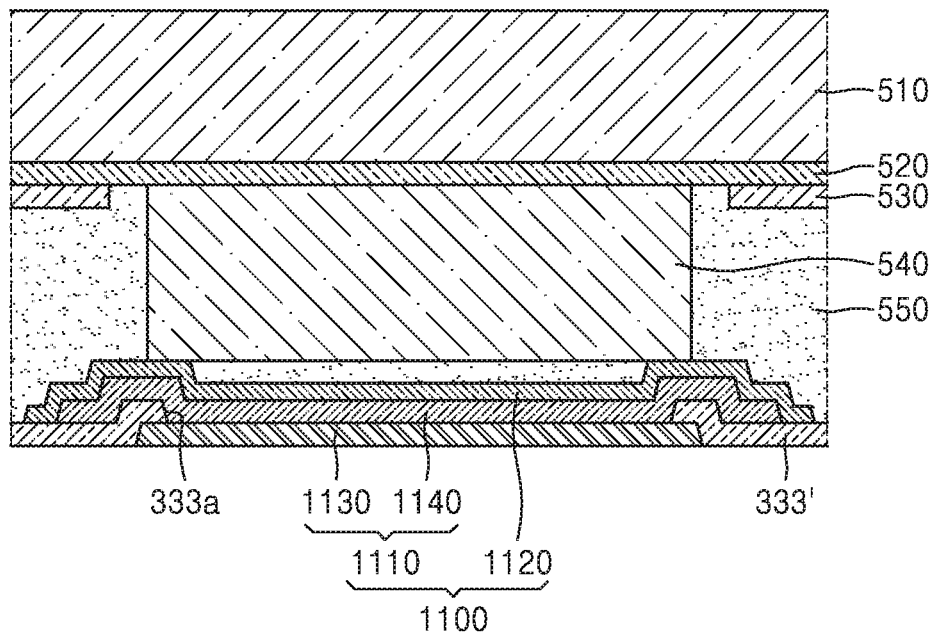
FIG. 16A is a cross-sectional view of a driving terminal connected to a pad terminal cut along a line I-I' of FIG. 15.
Figure 16B:
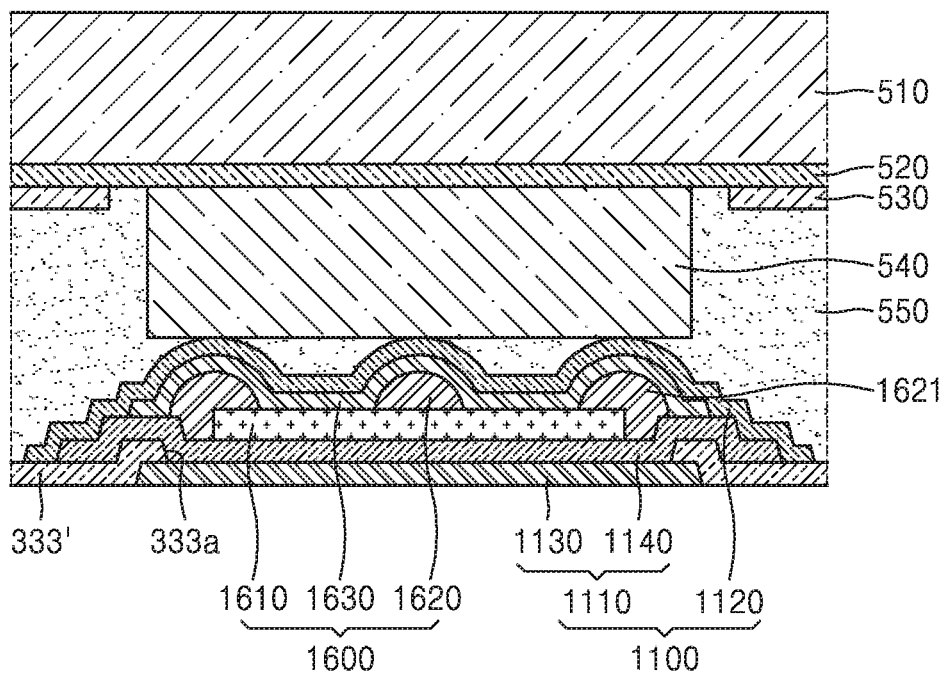
FIG. 16B is a cross-sectional view of a driving terminal connected to a pad terminal cut along a line II-II' of FIG. 15.

Referring to FIGS. 15, 16A, and 16B, which are modifications of FIG. 13, an elastic layer 1600 may be arranged on the lower conductive layer 1110. The elastic layer 1600 includes a first elastic layer 1610, a second elastic layer 1620 disposed on the first elastic layer 1610, and a third elastic layer 1630 disposed on the second elastic layer 1620.

The first elastic layer 1610 may be directly arranged on the second conductive layer 1140. The first elastic layer 1610 may include an organic material.

The second elastic layer 1620 may be arranged on the first elastic layer 1610. The second elastic layer 1620 may include a curvature pattern at its portion contacting the upper conductive layer 1120. The second elastic layers 1620 spaced apart from each other may include a stripe shape extending in the second direction (the Y-axis direction) of the substrate 301. Each second elastic layer 1620 may have a curved cross-section. Unlike the embodiment of FIG. 13, a second elastic layer 1621 arranged at an outermost portion of the first elastic layer 1610 may cover one edge of the first elastic layer 1610. The second elastic layer 1620 may include an organic material.

The third elastic layer 1630 may be arranged on the second elastic layer 1620. In an embodiment, the third elastic layer 1630 may cover both an upper surface of the first elastic layer 1610 and an upper surface of the second elastic layer 1620. In another embodiment, the third elastic layer 1630 may cover only an outer surface of the second elastic layer 1620. The third elastic layer 1630 may include an organic material.

In an embodiment, as far as the elastic layer 1600 has a structure having a curvature pattern and including one or more layers spaced apart from each other, a stacked structure of the elastic layer 1600 may be modified variously.

The upper conductive layer 1120 may cover the lower conductive layer 1110 and the elastic layer 1600. Specifically, the upper conductive layer 1120 may completely cover the second conductive layer 1140 in FIG. 16A, and the elastic layer 1600 covering the second conductive layer 1140 in FIG. 16B. At least a portion of the lower conductive layer 1110 may be electrically connected to at least a portion of the upper conductive layer 1120 in a region in which the elastic layer 1600 is not arranged.

In an embodiment, a shape and a stacked structure of the elastic layer 1600 may be modified variously.

Figure 25:
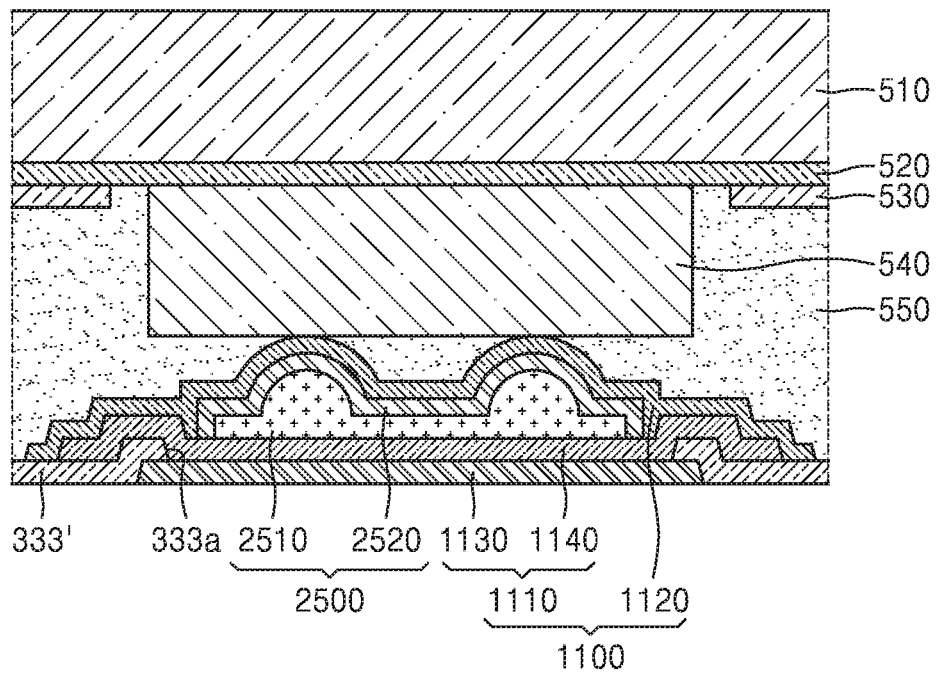
FIGS. 25 and 26 are views of a modification of an elastic layer of FIG. 12B.

Referring to FIG. 25, an elastic layer 2500 may be arranged on the lower conductive layer 1110. The above-described elastic layers have the three-layered structure, but the elastic layer 2500 according to the present embodiment may have a two-layered structure. Specifically, the elastic layer 2500 includes a first elastic layer 2510 having a predetermined curvature pattern and a second elastic layer 2520 arranged on the first elastic layer 2510. The first elastic layer 2510 according to the present embodiment may form the first elastic layer 1210 and the second elastic layer 1220 having the predetermined curvature pattern (see FIG. 12B) as one body by using one mask. The shape of the first elastic layer 2510 may include a hemisphere or half-ellipsoidal shape.

In another embodiment, the first elastic layer 2510 may include a stripe shape extending in the second direction (the Y-axis direction) of the substrate 301, and each curvature pattern may have a curved cross-section.

The first elastic layer 2510 may be arranged in a same layer as the protective layer 312 covering the source electrode 310 and the drain electrode 311, or be arranged in a same layer as the pixel-defining layer 316 defining a sub-pixel area. As far as the first elastic layer 2510 includes an organic material, the first elastic layer 2510 is not limited to one layer.

The second elastic layer 2520 may cover the first elastic layer 2510. The second elastic layer 2520 may be arranged in a same layer as one of the insulating layers 323 for a touch electrode covering the touch electrode 322. The second elastic layer 2520 may include an organic material. At least a portion of the lower conductive layer 1110 may be electrically connected to at least a portion of the upper conductive layer 1120 in a region in which the elastic layer 2500 is not arranged.

Figure 26:
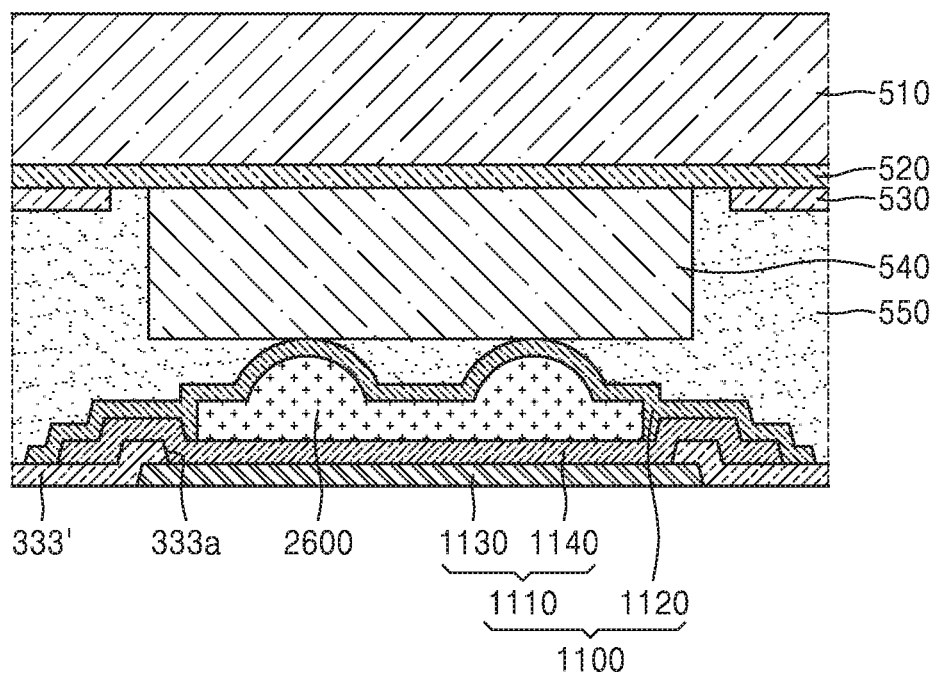

Referring to FIG. 26, an elastic layer 2600 may be arranged on the lower conductive layer 1110. Specifically, the elastic layer 2600 has a single-layered structure having a predetermined curvature pattern. The elastic layer 2600 according to the present embodiment may form a two or more-layered elastic layer as one body by using one mask. As far as the elastic layer 2600 has a structure having a predetermined curvature pattern, the elastic layer 2600 is not limited to one layer.

Also, the elastic layer 2600 may be arranged in a same layer as the protective layer 312 covering the source electrode 310 and the drain electrode 311 on the substrate 301, the pixel-defining layer 316 defining a sub-pixel area, and one of the insulating layers 323 for a touch electrode covering the touch electrode 322, and is not limited to one of the layers. The elastic layer 2600 may include an organic material.

In another embodiment, the lower conductive layer 1110, the upper conductive layer 1120, and the elastic layer 2600 may be modified variously by using a conductive material including an electrode arranged in the display area DA and an insulating material insulating the conductive material. At least a portion of the lower conductive layer 1110 may be electrically connected to at least a portion of the upper conductive layer 1120 in a region in which the elastic layer 2600 is not arranged.

Figure 27:
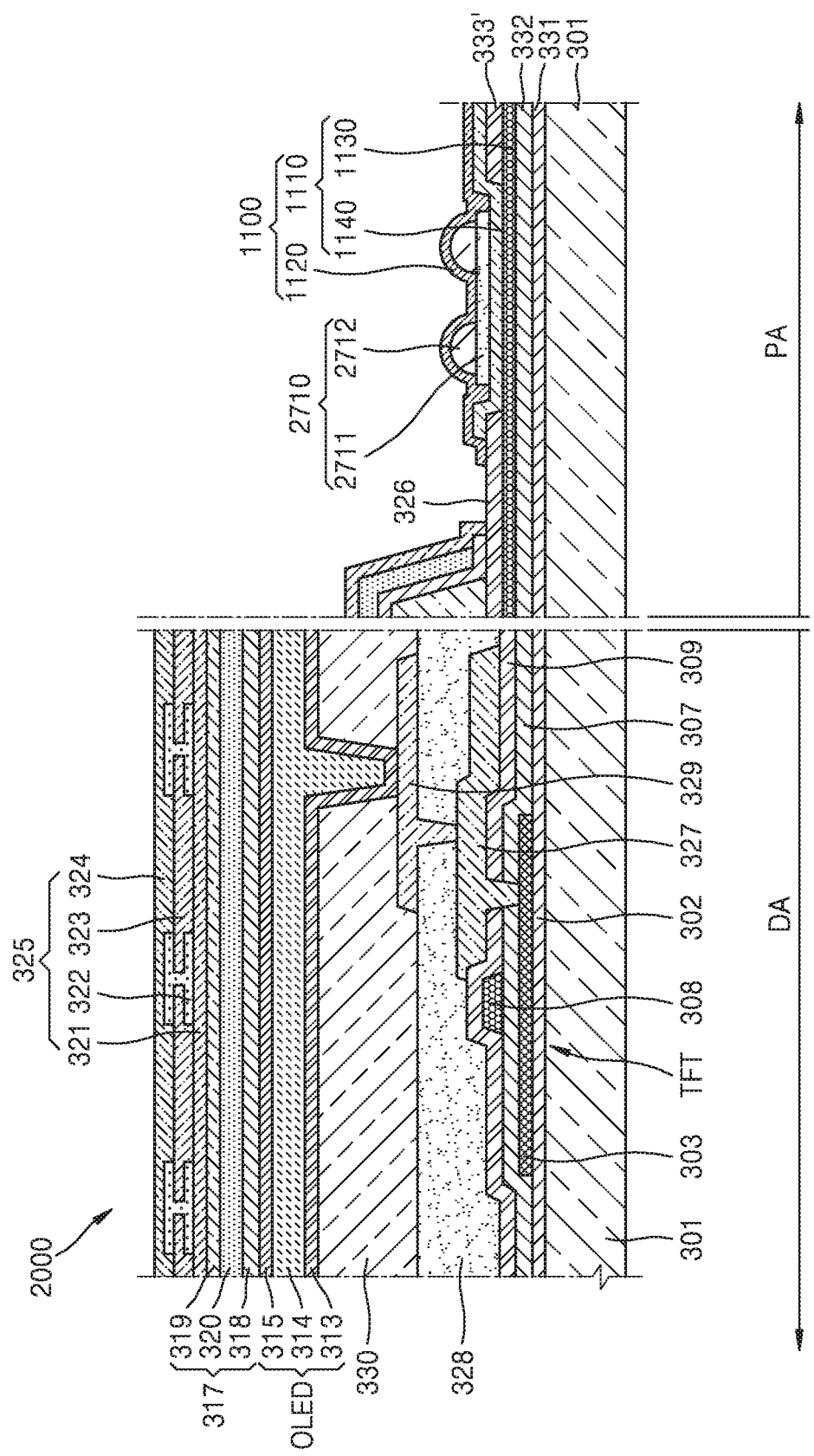
FIG. 27 is a view of a modification of a display panel of FIG. 10.

Referring to FIG. 27, a first conductive portion 327 may be arranged on the TFT. The first conductive portion 327 may include a source electrode, a drain electrode, or a data line. The first conductive portion 327 may be connected to the semiconductor layer 303 via a contact hole in the gate insulating layer 307 and the interlayer insulating layer 309.

The first conductive portion 327 may include a single layer or a multi-layer including one or more materials from among Al, Pt, Pd, Ag, Mg, Au, Ni, Nd, Ir, Cr, Li, Ca, Mo, Ti, W, and Cu. In an embodiment, the first conductive portion 327 may have a stacked structure of Ti/Al/Ti.

A first protective layer 328 may be arranged on the first conductive portion 327. The first protective layer 328 may be an organic insulating layer. The first protective layer 328 may be a passivation layer or a planarization layer. The first protective layer 328 may cover the first conductive portion 327. An inorganic insulating layer (not shown) may be further arranged between the first conductive portion 327 and the first protective layer 328 in order to prevent oxidation of the first conductive portion 327.

A second conductive portion 329 may be arranged on the first protective layer 328. The second conductive portion 329 may be connected to the first conductive portion 327 via a contact hole in the first protective layer 328. The second conductive portion 329 may reduce occurrence of parasitic capacitance between the gate electrode 308 and the first electrode 313. The second conductive portion 329 may include substantially the same material as that of the first conductive portion 327.

A second protective layer 330 may be arranged on the second conductive portion 329. The second protective layer 330 may be an organic insulating layer. The second protective layer 330 may cover the second conductive portion 329. An inorganic insulating layer (not shown) may be further arranged between the second conductive portion 329 and the second protective layer 330.

The OLED may be arranged on the second protective layer 330. The OLED includes the first electrode 313 corresponding to a pixel electrode, the intermediate layer 314 including an organic emissive layer, and the second electrode 315 corresponding to an opposite electrode. The first electrode 313 may be connected to the second conductive portion 329 via a contact hole in the second protective layer 330. The first conductive portion 327 and the second conductive portion 329 may be intermediate connection layers for connecting the semiconductor layer 303 to the first electrode 313. As described above, the OLED may be electrically connected to the TFT via the first conductive portion 327 and the second conductive portion 329.

In the present embodiment, the first conductive layer 1130 may be arranged in a same layer as the gate electrode 308. The first conductive layer 1130 may include the same material as that of the gate electrode 308 and may be formed during the same process as that of the gate electrode 308.

The second conductive layer 1140 arranged on the first conductive layer 1130 may be arranged in a same layer as the first conductive portion 327. The second conductive layer 1140 may include the same material as that of the first conductive portion 327 and may be formed during the same process as that of the first conductive portion 327. The second conductive layer 1140 may have a stacked structure of Ti/Al/Ti.

An elastic layer 2710 may be arranged on the second conductive layer 1140. The elastic layer 2710 includes a first elastic layer 2711 and a second elastic layer 2712 arranged on the first elastic layer 2711.

The first elastic layer 2711 may be arranged in a same layer as the first protective layer 328 covering the first conductive portion 327. The first elastic layer 2711 may include the same material as that of the first protective layer 328 and may be formed during the same process as that of the first protective layer 328. The first elastic layer 2711 may include an organic material.

The second elastic layer 2712 may include a predetermined curvature pattern at its portion contacting the upper conductive layer 1120. As far as the second elastic layer 2712 has a curvature pattern, the second elastic layer 2712 is not limited to one shape.

The second elastic layer 2712 may be arranged in a same layer as the second protective layer 330 covering the second conductive portion 329. The second elastic layer 2712 may include the same material as that of the second protective layer 330 and may be formed during the same process as that of the second protective layer 330. The second elastic layer 2712 may include an organic material. Though not shown, an organic insulating layer may be further arranged on the second elastic layer 2712.

The upper conductive layer 1120 may be arranged in a same layer as the touch electrode 322. The upper conductive layer 1120 may include the same material as that of the touch electrode 322 and may be formed during the same process as that of the touch electrode 322.

As described above, the lower conductive layer 1110 and the upper conductive layer 1120 may be arranged in a same layer as a conductive material including a plurality of electrodes arranged in the display area DA. The elastic layer 2710 may be arranged in a same layer as at least one insulating material insulating the conductive material. At least a portion of the lower conductive layer 1110 may be electrically connected to at least a portion of the upper conductive layer 1120 in a region in which the elastic layer 2710 is not arranged.

Meanwhile, during a pressurizing process, when pressurizing force applied on a region in which the above-described pad terminal 1100 and driving terminal 540 corresponding to each other are connected increases, a portion, for example, a lateral portion of the elastic layers 1200, 1400, 1600, 2500, 2600, and 2710 may be destroyed. To distribute pressurizing force applied to the connection region, one of the elastic layers 1200, 1400, 1600, 2500, 2600, and 2710 having the stacked structure may extend over an adjacent pad terminal 1100.

Figure 17:
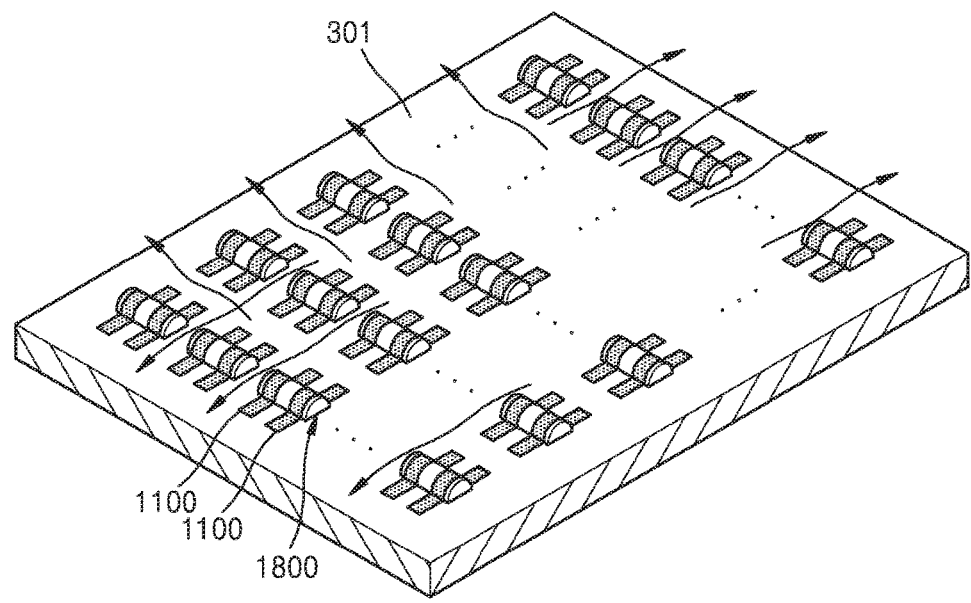
FIG. 17 is a cut perspective view of the substrate on which the plurality of pad terminals are arranged according to an embodiment.
Figure 18:
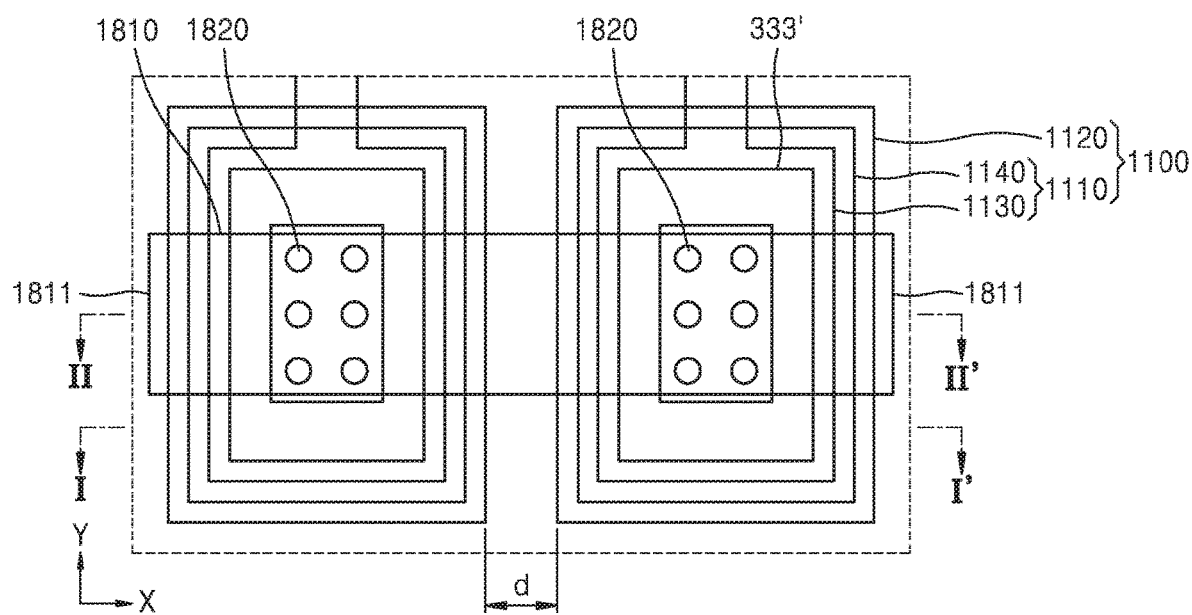
FIG. 18 is a plan view of a pair of pad terminals of FIG. 17.
Figure 19A:
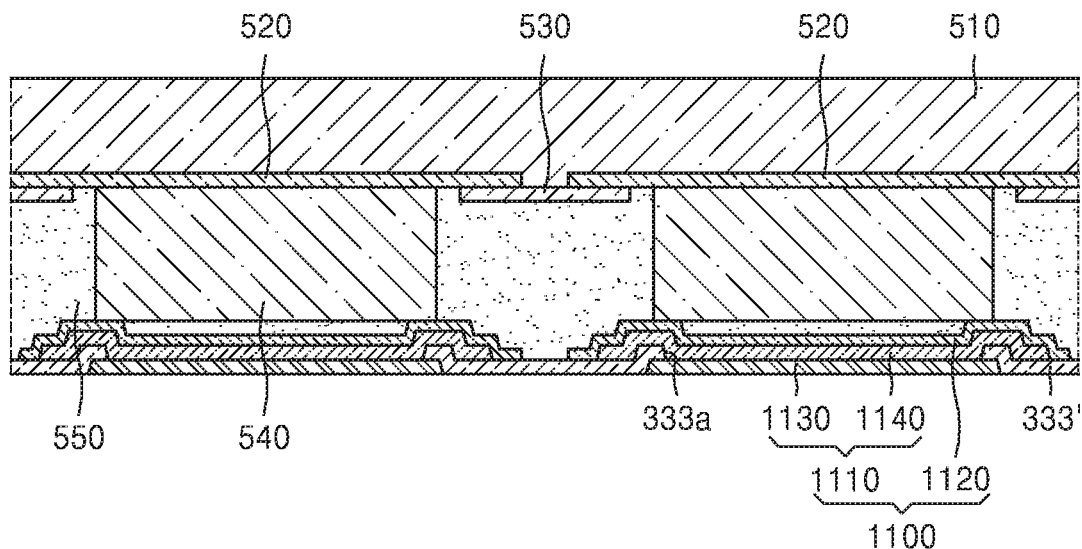
FIG. 19A is a cross-sectional view of the driving terminal connected to the pad terminals cut along a line I-I' of FIG. 18.
Figure 19B:
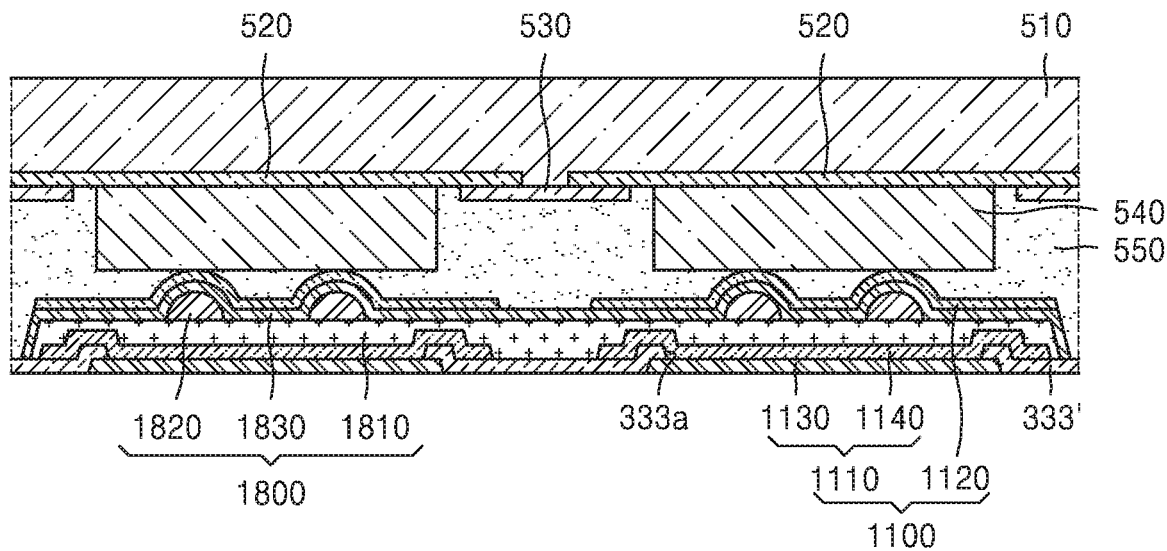
FIG. 19B is a cross-sectional view of the driving terminal connected to the pad terminals cut along a line II-II' of FIG. 18.

FIG. 17 is a cut perspective view of the substrate 301 on which the plurality of pad terminals 1100 are arranged according to an embodiment, FIG. 18 is a plan view of a pair of pad terminals 1100 of FIG. 17, FIG. 19A is a cross-sectional view of the driving terminal 540 connected to the pad terminals 1100 cut along a line I-I' of FIG. 18, and FIG. 19B is a cross-sectional view of the driving terminal 540 connected to the pad terminals 1100 cut along a line II-II' of FIG. 18;

Referring to FIGS. 17, 18, 19A, and 19B, the plurality of pad terminals 1100 may be arranged in the pad area PA of the substrate 301. Each pad terminal 1100 includes the lower conductive layer 1110 and the upper conductive layer 1120 disposed on the lower conductive layer 1110. In an embodiment, the plurality of pad terminals 1100 may be spaced apart from each other on the substrate 301.

An elastic layer 1800 may be arranged between the lower conductive layer 1110 and the upper conductive layer 1120. The elastic layer 1800 includes a first elastic layer 1810, a second elastic layer 1820 disposed on the first elastic layer 1810, and a third elastic layer 1830 disposed on the second elastic layer 1820.

One of the elastic layer 1810, 1820 and 1830 may extend over adjacent pad terminals 1100 in the first direction (the X-axis direction) of the substrate 301. Specifically, the first elastic layer 1810 may extend over the second conductive layer 1140 in the adjacent pad terminals 1100 through an interval "d" between the pair of adjacent pad terminals 1100.

The first elastic layer 1810 may extend in the first direction (the X-axis direction) crossing the second direction (the Y-axis direction) in which the upper conductive layer 1120 and the lower conductive layer 1110 extend. The first elastic layer 1810 has a stripe shape and includes a flat surface.

Opposite ends 1811 of the first elastic layer 1810 may protrude in the first direction (the X-axis direction) outside edges of the upper conductive layer 1120. The first elastic layer 1810 may include an organic material.

The second elastic layer 1820 may be arranged in a region corresponding to the first elastic layer 1810 of each pad terminal 1100. The second elastic layer 1820 may include a curvature pattern at its portion contacting the upper conductive layer 1120. The second elastic layers 1820 may be spaced apart from each other on each pad terminal 1100. In another embodiment, the second elastic layer 1820 and the first elastic layer 1810 may be one body. The second elastic layer 1820 may include an organic material.

The third elastic layer 1830 may be arranged on the second elastic layer 1820. In an embodiment, the third elastic layer 1830 may cover both an upper surface of the first elastic layer 1810 and an upper surface of the second elastic layer 1820. In another embodiment, the third elastic layer 1830 may cover only an outer surface of the second elastic layer 1820. The third elastic layer 1830 may include an organic material.

Each upper conductive layer 1120 may cover the lower conductive layer 1110 and the elastic layer 1800. Each upper conductive layer 1120 may completely cover the second conductive layer 1140 in FIG. 19A and partially cover the first elastic layer 1810 covering the second conductive layer 1140 in FIG. 19B. In this case, each upper conductive layer 1120 may be arranged on the first elastic layer 1810 and may not cover the protruding end 1811 of the first elastic layer 1810. At least a portion of the lower conductive layer 1110 may be electrically connected to at least a portion of the upper conductive layer 1120 in a region in which the elastic layer 1800 is not arranged.

As described above, since the elastic layer 1800 including the first elastic layer 1810 extends over the adjacent pad terminal 1100, when predetermined pressurizing force is applied, the pressure may be distributed. Consequently, destruction of the lateral portion of the elastic layer 1800 may be prevented.

Figure 20:
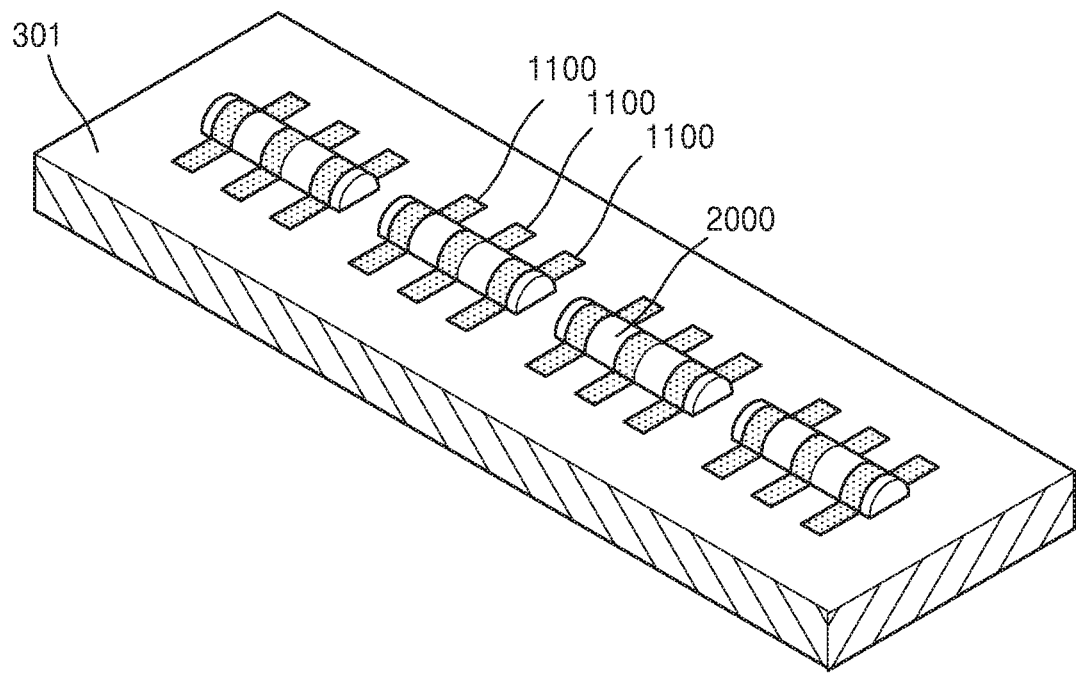
FIGS. 20 and 21 are views of modifications of a plurality of pad terminals of FIG. 18.
Figure 21:
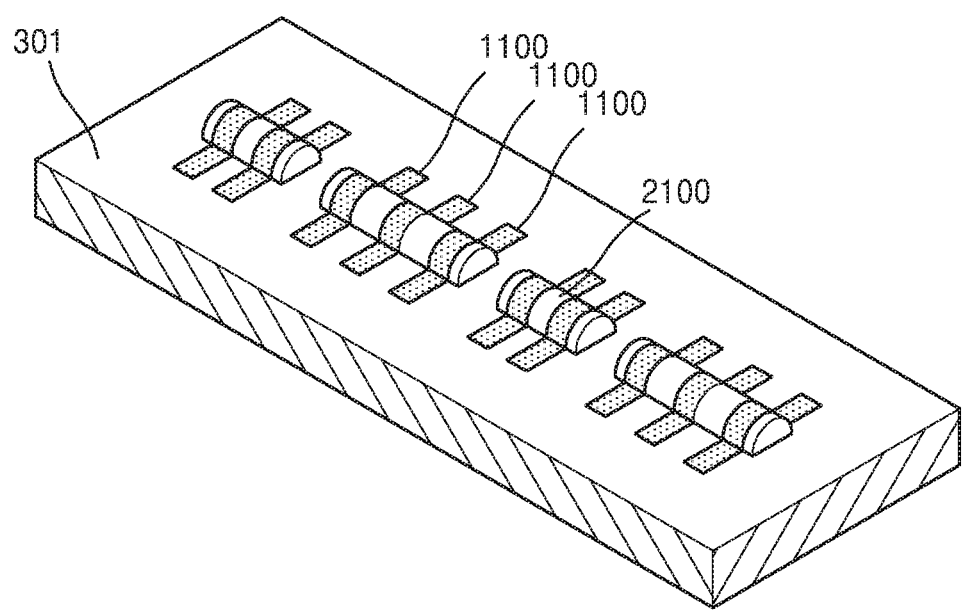
Figure 28:
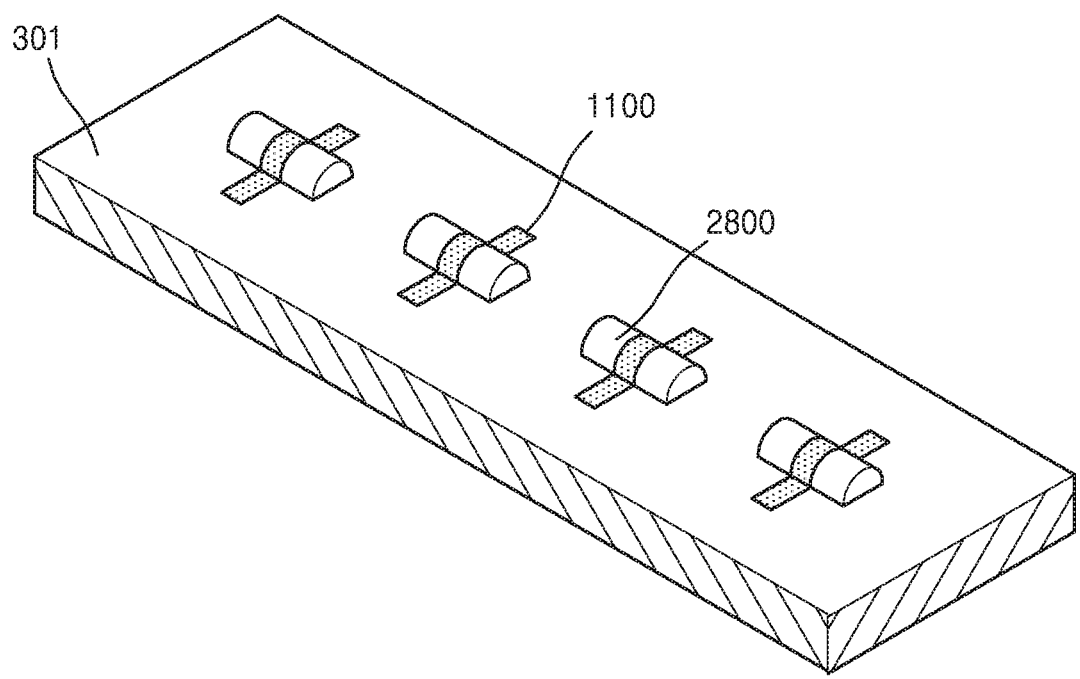
FIGS. 28 and 29 are views of modifications of a pair of pad terminals of FIG. 17.

In the present embodiment, though the first elastic layer 1810 extends over adjacent two pad terminals 1100, the number of pad terminals 1100 is not limited thereto. For example, as illustrated in FIG. 20, an elastic layer 2000 may extend over three or more pad terminals 1100, or as illustrated in FIG. 21, an elastic layer 2100 may extend over adjacent two pad terminals 1100 and adjacent three pad terminals 1100, or as illustrated in FIG. 28, an elastic layer 2800 may extend over a single pad terminal 1100.

Figure 29:
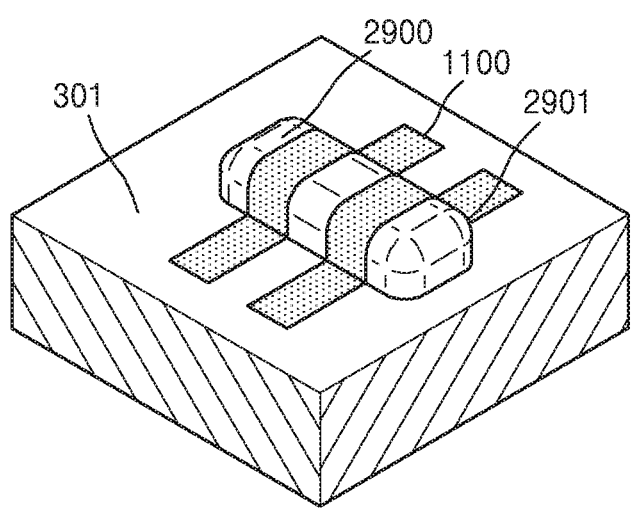

In another embodiment, as illustrated in FIG. 29, an end portion 2901 of an elastic layer 2900 may be sloped by a gentle angle. As far as the elastic layer 2900 includes a predetermined curvature pattern at its outer surface, the elastic layer 2900 is not limited to one shape.

Meanwhile, a flowing space for flowing of a molten adhesive material of the adhesive tape 550 may be required between the plurality of adjacent elastic layers 1800, 2000, 2100, 2800, and 2900.

Figure 22:
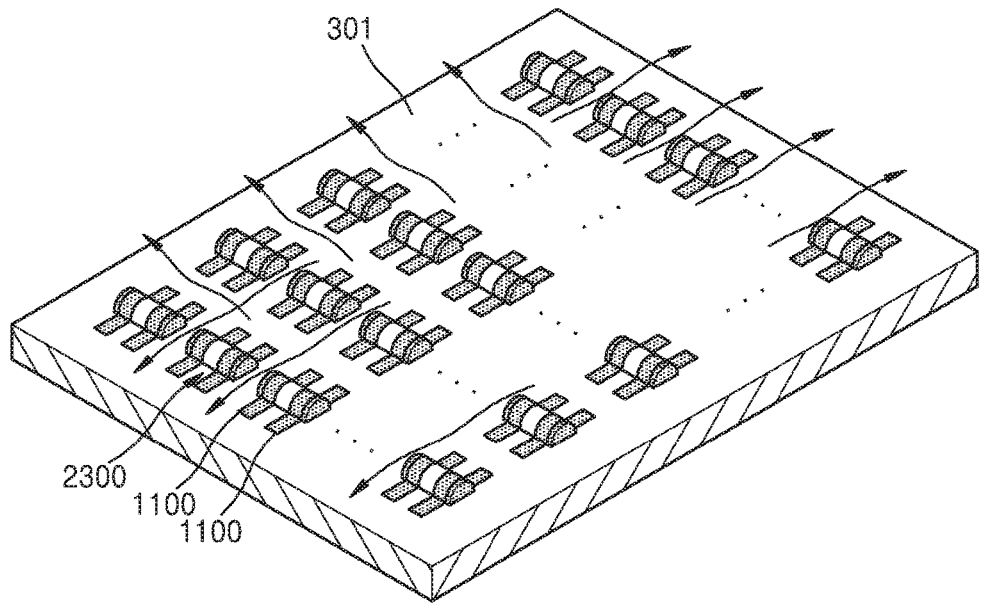
FIG. 22 is a cut perspective view of a substrate on which the plurality of pad terminals are arranged according to another embodiment.
Figure 23:
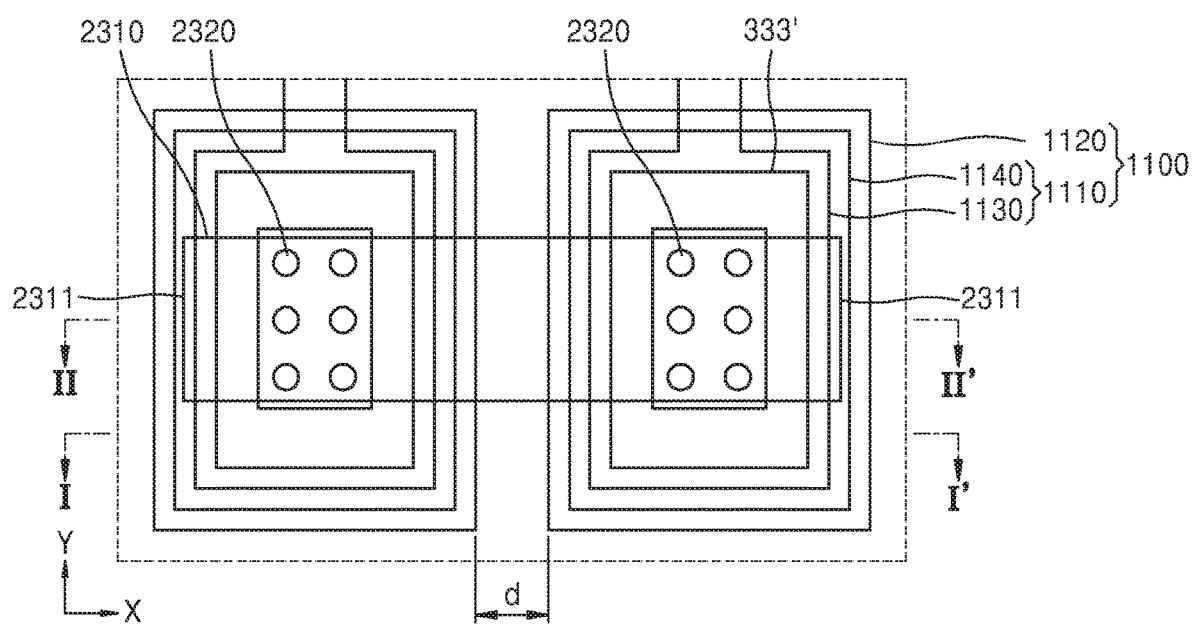
FIG. 23 is a plan view of a pair of pad terminals of FIG. 22.
Figure 24A:
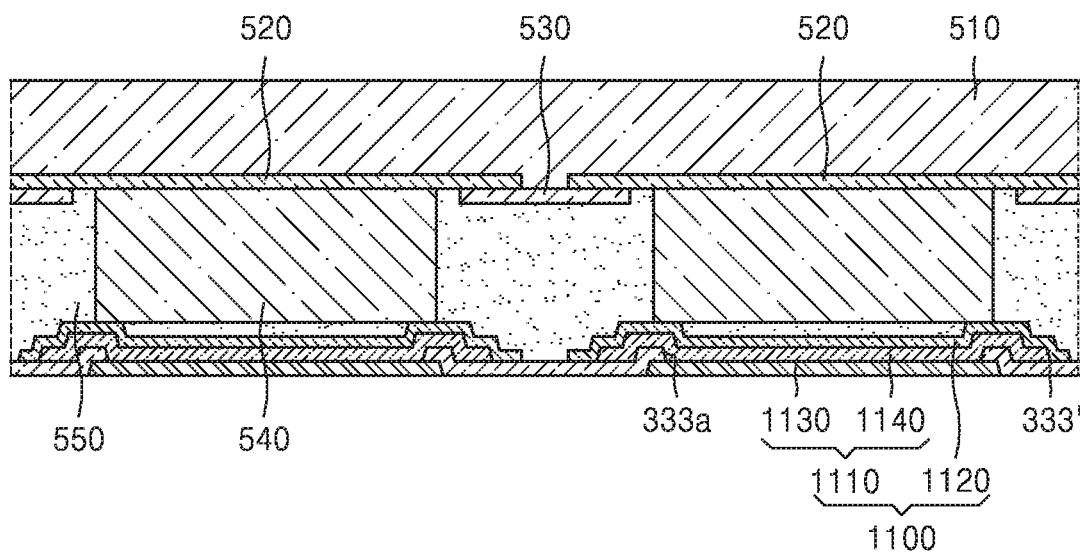
FIG. 24A is a cross-sectional view of the driving terminal connected to the pad terminals cut along a line I-I' of FIG. 23.
Figure 24B:
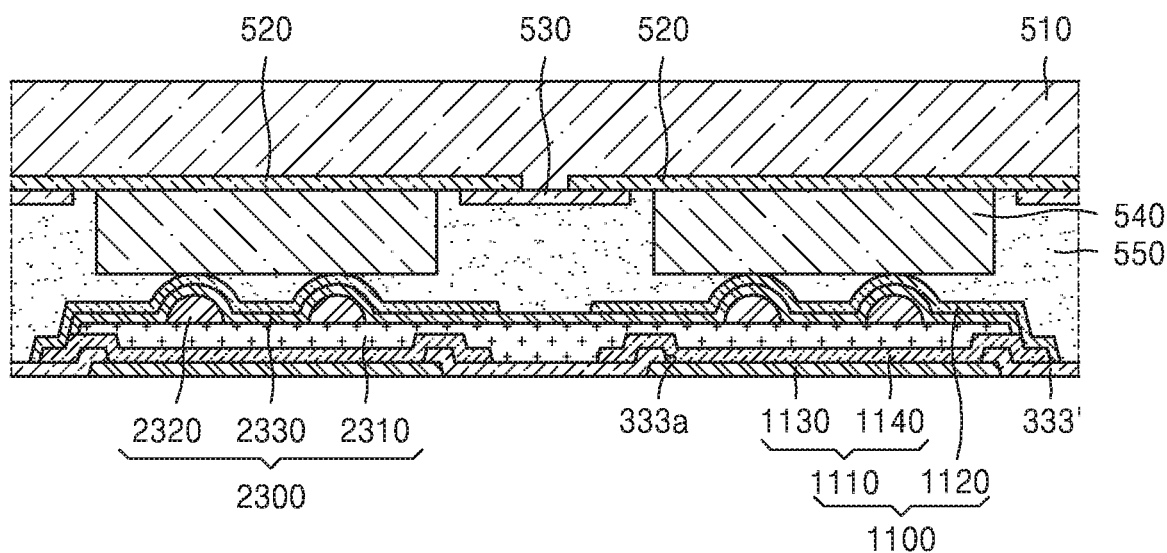
FIG. 24B is a cross-sectional view of the driving terminal connected to the pad terminals cut along a line II-II' of FIG. 23.

FIG. 22 is a cut perspective view of a substrate on which the plurality of pad terminals 1100 are arranged according to another embodiment, FIG. 23 is a plan view of the pair of pad terminals 1100 of FIG. 22, FIG. 24A is a cross-sectional view of the driving terminal 540 connected to the pad terminals 1100 cut along a line I-I' of FIG. 23, and FIG. 24B is a cross-sectional view of the driving terminal 540 connected to the pad terminals 1100 cut along a line II-II' of FIG. 23.

Referring to FIGS. 22, 23, 24A, and 24B, the plurality of pad terminals 1100 may be arranged in the pad area PA of the substrate 301. Each pad terminal 1100 includes the lower conductive layer 1110 and the upper conductive layer 1120 disposed on the lower conductive layer 1110. In an embodiment, the plurality of pad terminals 1100 may be spaced apart from each other on the substrate 301.

An elastic layer 2300 may be arranged between the lower conductive layer 1110 and the upper conductive layer 1120. The elastic layer 2300 includes a first elastic layer 2310, a second elastic layer 2320 disposed on the first elastic layer 2310, and a third elastic layer 2330 disposed on the second elastic layer 2320.

The first elastic layer 2310 may cover the second conductive layer 1140 of each of adjacent pad terminals 1100 and an interval "d" between the pair of adjacent pad terminals 1100 in the first direction (the X-axis direction) of the substrate 301. The first elastic layer 2310 has a stripe shape and includes a flat surface. Unlike the embodiment of FIG. 18, opposite ends 2311 of the first elastic layer 2310 may be arranged inside the edges of the upper conductive layer 1120 in the first direction (the X-axis direction). The first elastic layer 2310 may include an organic material.

The second elastic layer 2320 may be arranged in a region corresponding to the first elastic layer 2310 of each pad terminal 1100. The second elastic layer 2320 may include a curvature pattern at its portion contacting the upper conductive layer 1120. The second elastic layers 2320 may be spaced apart from each other on each pad terminal 1100. In another embodiment, the second elastic layer 2320 and the first elastic layer 2310 may be one body. The second elastic layer 2320 may include an organic material.

The third elastic layer 2330 may be arranged on the second elastic layer 2320. In an embodiment, the third elastic layer 2330 may cover both an upper surface of the first elastic layer 2310 and an upper surface of the second elastic layer 2320. In another embodiment, the third elastic layer 2330 may cover only an outer surface of the second elastic layer 2320. The third elastic layer 2330 may include an organic material.

Each upper conductive layer 1120 may cover each lower conductive layer 1110 and the elastic layer 2300. Each upper conductive layer 1120 may completely cover the second conductive layer 1140 in FIG. 24A and may partially cover the elastic layer 2300 covering the second conductive layer 1140 in FIG. 24B. In this case, each upper conductive layer 1120 may cover an end portion 2311 of the first elastic layer 2310 and may not cover the first elastic layer 2310 on the interval "d". At least a portion of the lower conductive layer 1110 may be electrically connected to at least a portion of the upper conductive layer 1120 in a region in which the elastic layer 2300 is not arranged.

As the elastic layer 2300 including the first elastic layer 2310 extends over an adjacent pad terminal 1100 as described above, destruction of the lateral portion of the elastic layer 2300 due to pressurizing force may be prevented.

As described above, a display device according to the present disclosure may reduce contact resistance between the pad terminal and the driving terminal. Therefore, contact reliability between the pad terminal and the driving terminal may be improved. Effects of the present disclosure may be readily derived from the description with reference to the accompanying drawings as well as the above description.

What is claimed is:

1. A display device comprising:
a substrate; and a plurality of pad terminals on the substrate,
wherein each of the plurality of pad terminals comprises
a lower conductive layer and an upper conductive layer disposed on the lower conductive layer,
an elastic layer disposed between the lower conductive layer and the upper conductive layer, the elastic layer being an insulating layer, and
at least a portion of the lower conductive layer being electrically connected to at least a portion of the upper conductive layer in a region in which the elastic layer is not arranged,
wherein a thin film transistor comprising a semiconductor layer, a gate electrode, a source electrode, and a drain electrode, a data line connected to the thin film transistor, an organic light-emitting diode comprising a first electrode, an emissive layer, and a second electrode, a touch sensor comprising a plurality of touch electrodes, and a plurality of insulating layers respectively disposed between electrodes are arranged on the substrate, and
wherein the electrodes are the gate electrode, the source electrode, the drain electrode, the first electrode, the second electrode, and the plurality of touch electrodes, and the lower conductive layer and the upper conductive layer being respectively arranged in a same layer as at least one of the electrodes and the data line, and the elastic layer being arranged in a same layer as at least one of the plurality of insulating layers is arranged on the substrate.

2. The display device of claim 1, wherein the elastic layer comprises an organic material arranged directly under the upper conductive layer.

3. The display device of claim 2, wherein the lower conductive layer is electrically connected to a wiring extended from a display area and the upper conductive layer is arranged in an island shape on the lower conductive layer.

4. The display device of claim 2, wherein at least one contact hole is arranged in the elastic layer, and
at least a portion of the lower conductive layer being electrically connected to at least a portion of the upper conductive layer via the contact hole.

5. The display device of claim 4, wherein the upper conductive layer extends over a region exposing the lower conductive layer via the first contact hole and a region in which the elastic layer covering the lower conductive layer is arranged.

6. The display device of claim 5, wherein the lower conductive layer is arranged in a same layer as the gate electrode, the upper conductive layer is arranged in a same layer as the data line, and the elastic layer is arranged in a same layer as an interlayer insulating layer disposed between the gate electrode and the source electrode and the drain electrode.

7. The display device of claim 5, wherein the lower conductive layer is arranged in a same layer as the gate electrode,
the upper conductive layer is arranged in a same layer as the first electrode, and
the elastic layer comprises a first elastic layer and a second elastic layer, the first elastic layer being arranged in a same layer as an interlayer insulating layer disposed between the gate electrode and the source electrode and the drain electrode, the second elastic layer being arranged on the interlayer insulating layer and arranged in a same layer as a protective layer covering the source electrode and the drain electrode.

8. The display device of claim 5, wherein a size of region of the exposed lower conductive layer may correspond to a size of the contact hole, and an edge of the lower conductive layer is covered by the elastic layer.

9. The display device of claim 2, wherein the upper conductive layer covers the lower conductive layer and the elastic layer, and
the elastic layer comprises a curvature pattern corresponding to its portion contacting the upper conductive layer.

10. The display device of claim 9, wherein the lower conductive layer comprises a first conductive layer and a second conductive layer disposed on the first conductive layer, the first conductive layer is electrically connected to the second conductive layer via a contact hole formed in an insulating layer covering at least a portion of the first conductive layer,
the elastic layer covers at least a portion of the second conductive layer exposed via the contact hole formed in the insulating layer, and
the upper conductive layer is arranged on the elastic layer and electrically connected to the second conductive layer in a region in which the elastic layer is not arranged.

11. The display device of claim 10, wherein the first conductive layer is arranged in a same layer as the gate electrode,
the second conductive layer is arranged in a same layer as the data line,
the elastic layer comprises a plurality of elastic layers and is arranged in a same layer as the plurality of insulating layers, the plurality of insulating layers being an interlayer insulating layer disposed between the gate electrode and the source electrode and the drain electrode, a protective layer covering the source electrode and the drain electrode, a pixel-defining layer defining a sub-pixel area, and an insulating layer for the touch electrode covering the touch electrode, and
the upper conductive layer is arranged in a same layer as the touch electrode.

12. The display device of claim 9, wherein the elastic layer comprises a plurality of stacked elastic layers, and
one of the plurality of stacked elastic layers comprises a curvature pattern.

13. The display device of claim 12, wherein the elastic layer comprises:
a first elastic layer disposed on the lower conductive layer and comprising a flat surface;
at least one second elastic layer disposed on the first elastic layer and comprising the curvature pattern; and
a third elastic layer disposed on the second elastic layer and covering the second elastic layer.

14. The display device of claim 13, wherein the second elastic layer comprises a plurality of second elastic layers spaced apart from each other on the first elastic layer.

15. The display device of claim 14, wherein each of the plurality of second elastic layers comprises a hemisphere or half-ellipsoidal shape.

16. The display device of claim 14, wherein each of the plurality of second elastic layers comprises a curved cross-section and comprises a stripe shape extending in one direction of the substrate.

17. The display device of claim 16, wherein a second elastic layer at an outermost portion from among the plurality of second elastic layers covers an edge of the first elastic layer.

18. The display device of claim 13, wherein at least two of the first elastic layer, the second elastic layer and the third elastic layer are formed in one body.

19. The display device of claim 13, wherein the plurality of pad terminals are spaced apart from each other on the substrate, and
    one of the plurality of elastic layers extends over an adjacent pad terminal, and the extended elastic layer extends over each lower conductive layer of an adjacent pad terminal and an interval between a pair of adjacent pad terminals.

20. The display device of claim 19, wherein the extended elastic layer extends in a direction crossing a direction in which the upper conductive layer and the lower conductive layer extend.

21. The display device of claim 19, wherein the extended elastic layer corresponds to the first elastic layer,
    the second elastic layer is arranged on the first elastic layer of each pad terminal, and
    the third elastic layer extends over the first elastic layer, the second elastic layer, and an interval between adjacent pad terminals.

22. The display device of claim 21, wherein opposite ends of the first elastic layer protrude outside edges of the upper conductive layer, and a region from which the first elastic layer protrudes is not covered by the upper conductive layer.

23. The display device of claim 21, wherein opposite ends of the first elastic layer are arranged inside edges of the upper conductive layer, and the opposite ends of the first elastic layer are covered by the upper conductive layer.

24. The display device of claim 12, wherein the lower conductive layer is arranged in a same layer as the gate electrode, the source electrode, the drain electrode, the first electrode, and the second electrode,
    the elastic layer is arranged in a same layer as the plurality of insulating layers, the plurality of insulating layers being an interlayer insulating layer disposed between the gate electrode and the source electrode and the drain electrode, a protective layer covering the source electrode and the drain electrode, a pixel-defining layer defining the sub-pixel area, and an insulating layer for a touch electrode covering the touch electrode, and
    the upper conductive layer is arranged in a same layer as the touch electrode.

\* \* \* \* \*

UNITED STATES PATENT AND TRADEMARK OFFICE
CERTIFICATE OF CORRECTION

PATENT NO. : 10,510,821 B2  
APPLICATION NO. : 15/617420  
DATED : December 17, 2019  
INVENTOR(S) : Jungyun Jo et al.

Page 1 of 1

It is certified that error appears in the above-identified patent and that said Letters Patent is hereby corrected as shown below:

On the Title Page

Item (73) Assignee should read as "Samsung Display Co., Ltd.", not "Innovation Counsel LLP"

Signed and Sealed this  
Nineteenth Day of May, 2020

Andrei Iancu  
*Director of the United States Patent and Trademark Office*